(12) United States Patent  
Sakakibara et al.

(10) Patent No.: US 7,553,722 B2  
(45) Date of Patent: Jun. 30, 2009

(54) SEMICONDUCTOR DEVICE AND METHOD FOR MANUFACTURING THE SAME

(75) Inventors: Jun Sakakibara, Anjo (JP); Hitoshi Yamaguchi, Nisshin (JP); Naohiro Suzuki, Anjo (JP)

(73) Assignee: DENSO CORPORATION, Kariya (JP)

( * ) Notice: Subject to any disclaimer, the term of this patent is extended or adjusted under 35 U.S.C. 154(b) by 326 days.

(21) Appl. No.: 11/434,124

(22) Filed: May 16, 2006

(65) Prior Publication Data

US 2006/0275980 A1 Dec. 7, 2006

(30) Foreign Application Priority Data

Jun. 3, 2005 (JP) ............................. 2005-164492

(51) Int. Cl.  
*H01L 21/8242* (2006.01)

(52) U.S. Cl. ...................... 438/246; 257/213; 257/361; 438/253

(58) Field of Classification Search ................ 438/424, 438/269, 700, 246, 253; 257/213, 357–361  
See application file for complete search history.

(56) References Cited

U.S. PATENT DOCUMENTS

| 5,751,022 | A  | * | 5/1998 | Yasuhara et al. ............ 257/133 |
| 6,365,932 | B1 |   | 4/2002 | Kouno et al. |
| 6,525,375 | B1 |   | 2/2003 | Yamaguchi et al. |
| 6,630,389 | B2 | * | 10/2003 | Shibata et al. .............. 438/424 |
| 6,696,323 | B2 |   | 2/2004 | Yamaguchi et al. |
| 2003/0139012 | A1 | * | 7/2003 | Yamauchi et al. ........... 438/269 |

* cited by examiner

*Primary Examiner*—N Drew Richards  
*Assistant Examiner*—Mamadou Diallo  
(74) *Attorney, Agent, or Firm*—Posz Law Group, PLC

(57) ABSTRACT

A semiconductor device includes: a semiconductor substrate having a first surface and a second surface, wherein the substrate has a first conductive type; a first trench extending from the first surface of the semiconductor substrate in a depth direction; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio equal to or larger than 1.

1 Claim, 16 Drawing Sheets

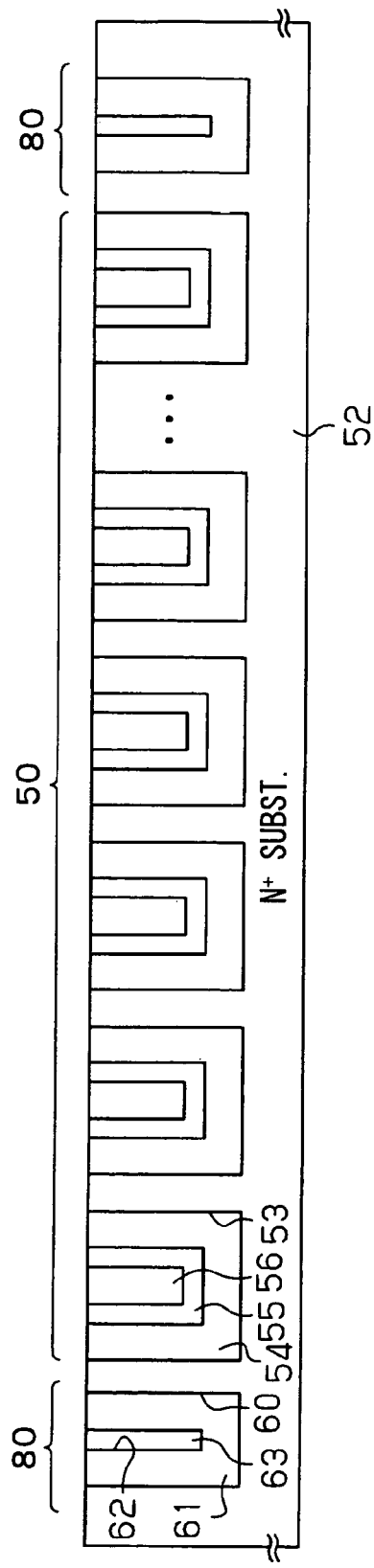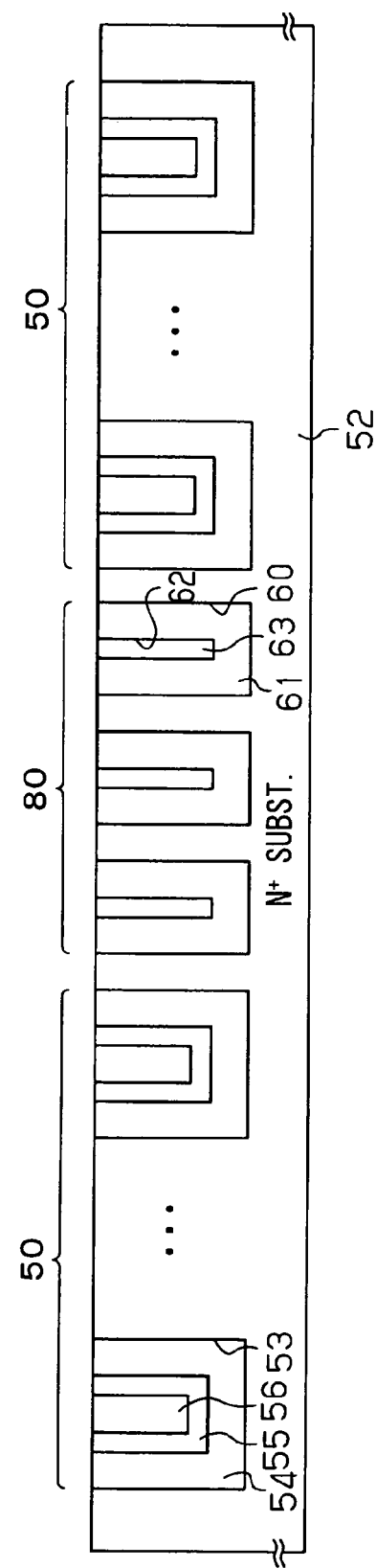
FIG. 16A
FIG. 16B

SEMICONDUCTOR DEVICE AND METHOD FOR MANUFACTURING THE SAME

CROSS REFERENCE TO RELATED APPLICATION

This application is based on Japanese Patent Application No. 2005-164492 filed on Jun. 3, 2005, the disclosure of which is incorporated herein by reference.

FIELD OF THE INVENTION

The present invention relates to a semiconductor device and a method for manufacturing the same.

BACKGROUND OF THE INVENTION

Generally speaking, in semiconductor devices, protection elements are formed on the same chips in order that surge currents caused by static electric energy and inverse electromotive force of inductive loads may not destroy internal semiconductor elements. For instance, U.S. Pat. No. 6,365,932 discloses the technical idea as to the above-explained semiconductor element protection.

In a case where a MOSFET functioning as a switching element, a load and a power supply are connected in a series manner, and the MOSFET is switched so as to drive the load, when a surge current is applied from an external source to the MOSFET as an internal element, the MOSFET may be easily destroyed due to a local parasitic NPN transistor operation. As a result, a protection diode is provided between a source and a drain of the MOSFET.

In order to achieve a sufficiently high protection function, the protection diode requires such a performance that this protection diode instantaneously discharges large currents, so that a diode having a low resistance is required.

Generally speaking, diodes are manufactured by implanting ions and performing thermal diffusion with respect to semiconductor substrates. As a consequence, in such a case that both the internal MOSFET and the protection diode are formed in an one chip, the protection diode is constructed by forming both a P region and an N$^+$ region in a surface layer portion of an N$^-$ substrate. In the P region, a PN junction is formed in a relatively shallow region along a thickness direction of the substrate in such a manner that the P region is widened along a plane direction of the substrate. More precisely speaking, when the P region is manufactured, after an oxide film has been formed on an upper plane of the N$^-$ substrate, a mask is arranged. Thereafter, ion implantation is carried out, and also, the P region is formed by way of thermal diffusion.

However, when such a diode having a low resistance value, namely having a sufficiently large junction area is formed on a chip, there is a problem that the area of this chip is increased.

SUMMARY OF THE INVENTION

In view of the above-described problem, it is an object of the present disclosure to provide a semiconductor device capable of realizing a protection diode having a small area and a low resistance value.

According to a first aspect of the present disclosure, a semiconductor device includes: a semiconductor substrate having a first surface and a second surface, wherein the semiconductor substrate has a first conductive type; a first trench extending from the first surface of the semiconductor substrate in a depth direction perpendicular to the first surface of the semiconductor substrate; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio between a depth and a width, the aspect ratio being equal to or larger than 1.

The above device provides a diode having a small plan area and a low resistance.

According to a second aspect of the present disclosure, a semiconductor device includes: a semiconductor switching element; a protection diode for protecting the semiconductor switching element; and a semiconductor substrate having a first surface and a second surface. The semiconductor switching element and the protection diode are integrated into one chip so that the semiconductor switching element and the protection diode are disposed in the semiconductor substrate. The semiconductor substrate has a first conductive type. The protection diode includes: a first trench extending from the first surface of the semiconductor substrate in a depth direction perpendicular to the first surface of the semiconductor substrate; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio between a depth and a width, the aspect ratio being equal to or larger than 1.

The above device provides a diode having a small plan area and a low resistance. Thus, the plan chip area of the device is reduced.

According to a third aspect of the present disclosure, a semiconductor device includes: a semiconductor integrated circuit; a protection diode for protecting the semiconductor integrated circuit; and a semiconductor substrate having a first surface and a second surface. The semiconductor integrated circuit and the protection diode are integrated into one chip so that the semiconductor integrated circuit and the protection diode are disposed in the semiconductor substrate. The semiconductor substrate has a first conductive type. The protection diode includes: a first trench extending from the first surface of the semiconductor substrate in a depth direction perpendicular to the first surface of the semiconductor substrate; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio between a depth and a width, the aspect ratio being equal to or larger than 1.

The above device provides a diode having a small plan area and a low resistance. Thus, the plan chip area of the device is reduced.

According to a fourth aspect of the present disclosure, a method for manufacturing a semiconductor device includes: forming the third trench of the three dimensional power MOSFET together with the second trench of the semiconductor substrate; forming the drift semiconductor layer in the third trench of the MOSFET together with forming the low concentration layer in the second trench of the semiconductor substrate, wherein the drift semiconductor layer and the low concentration layer are made of an epitaxial film; and embedding the base semiconductor layer in the drift semiconductor layer together with embedding the epitaxial semiconductor layer in the low concentration layer, wherein the base semiconductor layer and the epitaxial semiconductor layer are made of an epitaxial film.

In the above method, the planar chip area of the device is minimized with a simple method for forming the protection diode.

BRIEF DESCRIPTION OF THE DRAWINGS

The above and other objects, features and advantages of the present invention will become more apparent from the following detailed description made with reference to the accompanying drawings. In the drawings:

FIG. 16A is a cross sectional view showing the device taken along line XVIA-XVIA in FIG. 15A, and FIG. 16B is a cross sectional view showing the device taken along line XVIB-XVIB in FIG. 15B;

DETAILED DESCRIPTION OF THE PREFERRED EMBODIMENTS

Inventors have preliminarily studied about a semiconductor device having a protection element therein.

Figure 21:
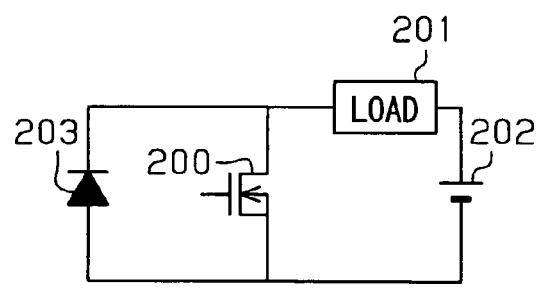
FIG. 21 is a circuit diagram showing a protection element according to a comparison of the first embodiment of the present invention.
Figure 22:
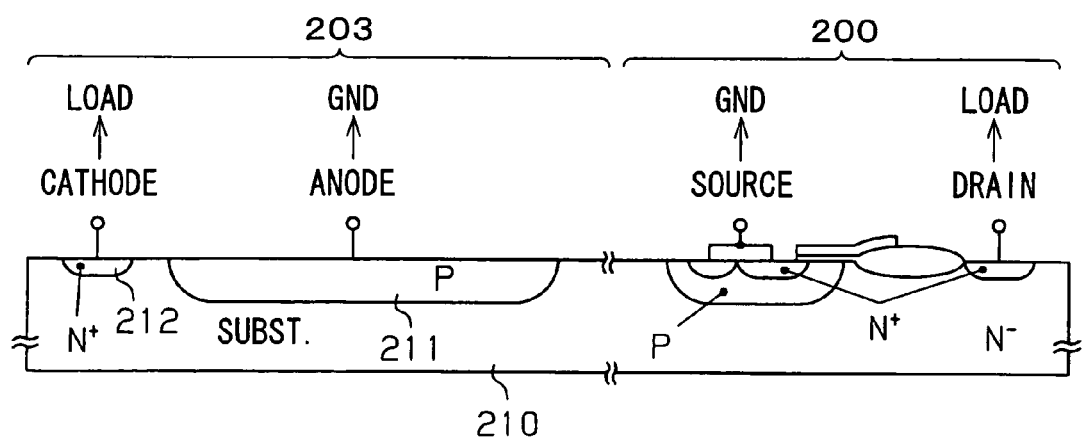
FIG. 22 is a cross sectional view showing the protection element according to the comparison of the first embodiment.
Figure 23A:
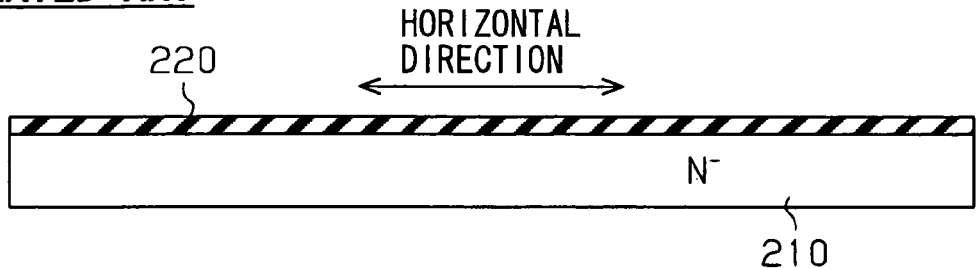
FIGS. 23A to 23D are cross sectional views explaining a method for manufacturing the protection element according to the comparison of the first embodiment.
Figure 23B:
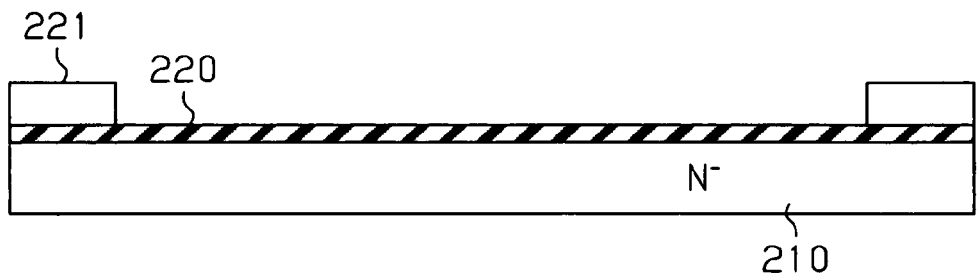
Figure 23C:
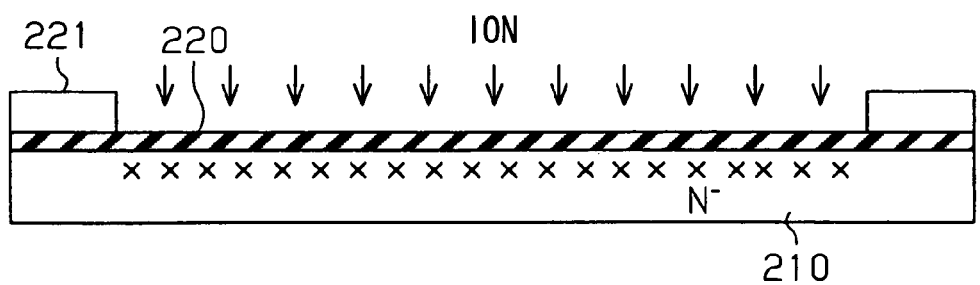
Figure 23D:
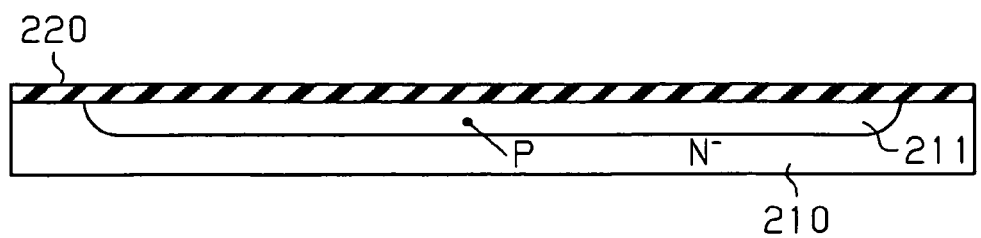

FIGS. 21 and 22 show an example as to simplified structures of protection elements of the related art. In FIG. 21, in the case that a MOSFET 200 functioning as a switching element, a load 201, and a power supply 202 are connected in a series manner, and the MOSFET 200 is switched so as to drive the load 201, when a surge current is applied from an external source to the MOSFET 200 as an internal element, the MOSFET 200 may be easily destroyed due to a local stray NPN transistor operation. As a result, a protection diode 203 is provided between a source and a drain of the MOSFET 200.

In order to achieve a sufficiently high protection function, the protection diode 203 requires such a performance that this protection diode 203 instantaneously discharges large currents, so that a diode having a low resistance is required.

As shown in FIG. 22, in such a case that both the internal MOSFET 200 and the protection diode 203 are formed in an one chip, the protection diode 203 is constructed by forming both a P region 211 and an $N^+$ region 212 in a surface layer portion of an $N^-$ substrate 210. In the P region 211, a PN junction is formed in a relatively shallow region along a thickness direction of the substrate in such a manner that the P region 211 is widened along a plane direction of the substrate. More precisely speaking, when the P region 211 is manufactured, as shown in FIGS. 23A to 23D, after an oxide film 220 has been formed on an upper plane of the $N^-$ substrate 210, a mask 221 is arranged. Thereafter, ion implantation is carried out, and also, the P region 211 is formed by way of thermal diffusion.

However, when such a diode having a low resistance value, namely having a sufficiently large junction area is formed on a chip, the area of this chip may be increased.

First Embodiment

Figure 1:
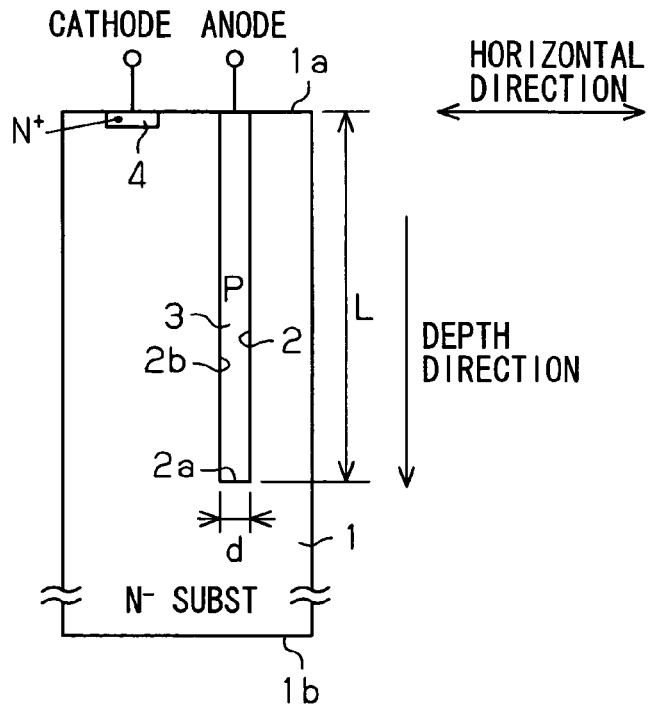
FIG. 1 is a cross sectional view showing a semiconductor device according to a first embodiment of the present invention.

FIG. 1 shows a longitudinal sectional view of a semiconductor device according to a first embodiment of the present invention. The semiconductor device corresponds to a protection diode, and has been manufactured in a substrate. This protection diode is employed in order to protect an element which has been formed in the same substrate as that of the protection diode, or to protect an element formed in another chip in order that these elements may not be destroyed by a surge current caused by static electric energy and inverse electromotive force of an inductive load.

While an N⁻ type silicon substrate 1 functioning as a first conductivity type semiconductor substrate owns a major front surface 1a and a rear surface 1b, a diode has been manufactured in the N⁻ type silicon substrate 1. Concentration of the N⁻ type silicon substrate 1 is $1 \times 10^{14}$ to $1 \times 10^{18}$ cm⁻³.

A trench (diode forming-purpose trench) 2 has been formed in the major front surface 1a of the N⁻ type silicon substrate 1, and the trench 2 has been elongated from the major front surface 1a of the N⁻ type silicon substrate 1 along a thickness direction of the substrate 1. A width "d" of the trench 2 is 0.1 to 10 μm, and a depth "L" of the trench 2 is 1 to 100 μm, and an aspect ratio (=L/d) is larger than, or equal to "1." A P type silicon layer (namely, second conductivity type semiconductor layer) 3 made of an epitaxial film has been formed in the trench 2. Since the P type silicon layer 3 is made of the epitaxial film, impurity concentration is substantially uniform from the major front surface 1a of the substrate 1 up to a predetermined position along a thickness direction of the substrate 1. Concentration of the P type silicon layer 3 is $1 \times 10^{14}$ to $1 \times 10^{20}$ cm⁻³. The P type silicon layer 3 has been connected to an anode electrode.

In the major front surface 1a of the N⁻ type silicon substrate 1, a contact-purpose N⁺ region 4 has been formed at a position separated from the trench 2. The contact-purpose N⁺ region 4 has been connected to a cathode electrode. Both the anode electrode and the cathode electrode have been formed on the major front surface 1a of the substrate 1.

As previously explained, the diode owns the inner plane of the trench 2 whose aspect ratio is larger than "1", namely has a PN junction between the N⁻ type silicon substrate 1 and the P type silicon layer 3 on a bottom plane 2a and a side plane 2b. As a result, the diode having the small area and the low resistance value can be realized, and an increase of the chip area caused by the protection diode can be suppressed. Precisely speaking, in the conventional structure (namely, protection diode 203) shown in FIG. 22, the surface layer portion of the N⁻ type substrate 210 owns the PN junction which is broadened along the plane direction of the substrate in the P type region 211 by way of the ion implantation. When the resistance value of the protection diode 203 is tried to be lowered, the increase of the chip area is conducted. In contact to the conventional protection diode 203, in this first embodiment, since the P type silicon layer 3 is embedded in the trench 2 whose aspect ratio is large, the protection diode owns the PN junction which is elongated along the thickness direction of the substrate, and such a diode having the small area and the low resistance value can be manufactured.

Next, a description is made of a manufacturing method. While an N⁻ type silicon substrate 1 is prepared, a trench 2 having a predetermined depth is formed in the N⁻ type silicon substrate 1. Then, a P type epitaxial film (3) is formed on the N⁻ type silicon substrate 1 so as to embed an internal portion of the trench 2 by the P type epitaxial film (3).

Thereafter, an unnecessary P type epitaxial film (3) on the major front surface 1a of the N⁻ type silicon substrate 1 is polished in order to be removed. Furthermore, a contact-purpose N⁺ type region 4 is formed in the major front surface 1a of the N⁻ type silicon substrate 1. As a result, the semiconductor device (diode) shown in FIG. 1 may be manufactured in the substrate.

It should be noted that the conductivity types (N types and P types) indicated in FIG. 1 may be alternatively reversed.

Figure 2:
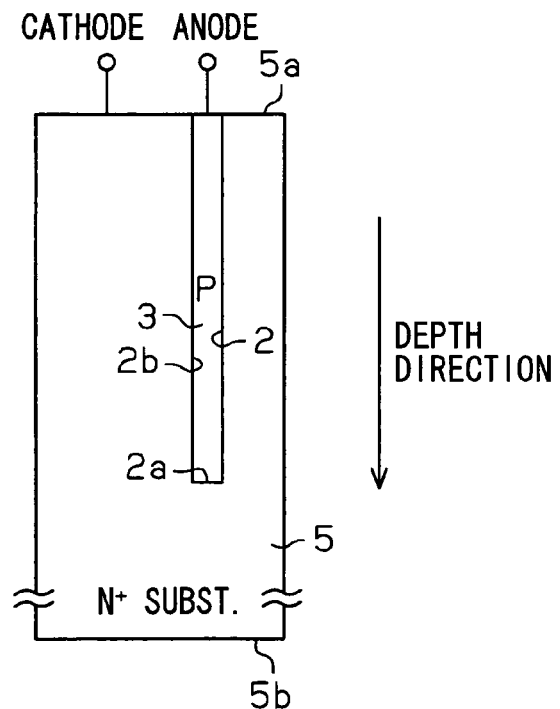
FIG. 2 is a cross sectional view showing a semiconductor device according to a modification of the first embodiment of the present invention.

FIG. 2 shows a longitudinal sectional view of a semiconductor device, which may be replaced by that of FIG. 1.

Although the diode has been formed in the N⁻ type silicon substrate 1 in FIG. 1, the diode has been formed in an N⁺ type silicon substrate 5 in FIG. 2. The N⁺ type silicon substrate 5 functioning as a first conductivity type semiconductor substrate has a major front surface 5a and a rear surface 5b, and a trench 2 has been elongated from the major front surface 5a of the N⁺ type silicon substrate 5 along a thickness direction of the substrate 5. A P type silicon layer 3 made of an epitaxial film has been formed within the trench 2. In an inner plane (bottom plane 2a and side plane 2b) of the trench 2 whose aspect ratio is larger than "1", a PN junction constituted by the N⁺ type silicon substrate 5 and the P type silicon layer 3 is provided, and the N⁺ type silicon substrate 5 is used as the cathode side, whereas the P type silicon layer 3 is used as the anode side.

Concentration of the N⁺ type silicon substrate 5 is $1 \times 10^{18}$ to $1 \times 10^{20}$ cm⁻³. It should also be noted that concentration of the P type silicon layer 3 is $1 \times 10^{14}$ to $1 \times 10^{20}$ cm⁻³. A width of the trench 2 is 0.1 to 10 μm, and a depth of the trench 2 is 1 to 100 μm.

As to a manufacturing method, a trench 2 having a desirable depth is formed in the N⁺ type silicon substrate 5, and the trench 2 is embedded by a P type epitaxial film (3), and then, an unnecessary epitaxial film (3) is polished so as to be removed. Both an anode electrode and a cathode electrode are formed on the major front surface 5a of the N⁺ type silicon substrate 5. It should also be noted that the cathode electrode may be alternatively formed on the rear surface 5b of the N⁺ type silicon substrate 5. Also, it should be understood that the conductivity types (N types and P types) indicated in FIG. 2 may be alternatively reversed.

Second Embodiment

Next, a difference between the first embodiment and a second embodiment will be mainly explained.

Figure 3:
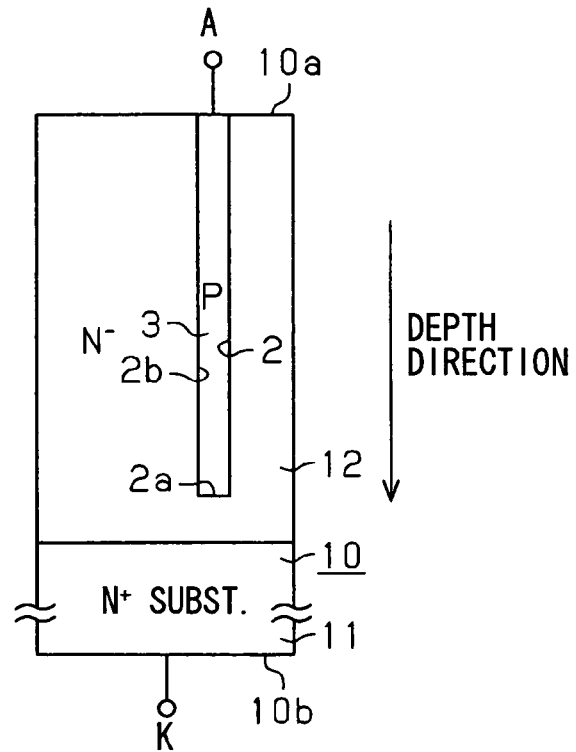
FIG. 3 is a cross sectional view showing a semiconductor device according to a second embodiment of the present invention.

FIG. 3 shows a longitudinal sectional view of a semiconductor device according to this second embodiment.

A different point from the first embodiment is given as follows: That is, as a semiconductor substrate (N type substrate) 10 functioning as a first conductivity type semiconductor substrate, an N⁺/N⁻ epitaxial substrate is employed in which an N⁻ type silicon layer (first conductivity type epitaxial film having low concentration) 12 has been formed on an N⁺ type silicon substrate 11 (first conductivity type substrate having high concentration). The semiconductor substrate (N type substrate) 10 owns a major front surface 10a and a rear surface 10b.

In the N⁻ type silicon layer (first conductivity type epitaxial film having low concentration) 12, a trench 2 has been elongated from the major front surface 10a (upper plane of N⁻ type silicon layer 12) of the semiconductor substrate 10 along a thickness direction of the semiconductor substrate 10. A P type silicon layer 3 made of an epitaxial film has been formed within the trench 2. In an inner plane (bottom plane 2a and side plane 2b) of the trench 2 whose aspect ratio is larger than "1", a PN junction constituted by the substrate 10 and the P type silicon layer 3 is provided.

As previously explained, the semiconductor substrate 10 is arranged by that the N⁻ type silicon layer (epitaxial layer having low concentration) 12 has been formed on the N⁺ type silicon substrate 11, and the diode forming-purpose trench 2 has been formed in the N⁻ type silicon layer 12 in this semiconductor substrate 10. As a consequence, even under the high withstanding voltage, such a diode having a small area and a low resistance value can be realized.

Concentration of the N⁺ type silicon substrate 11 is $1 \times 10^{18}$ to $1 \times 10^{20}$ cm⁻³. Concentration of the N⁻ type silicon layer (epitaxial layer) 12 is $1 \times 10^{14}$ to $1 \times 10^{18}$ cm⁻³. Also, concentration of the P type silicon layer 3 is $1\times10^{14}$ to $1\times10^{20}$ cm$^{-3}$. A width of the trench 2 is 0.1 to 10 μm, and a depth of the trench 2 is 1 to 100 μm.

As to a manufacturing method, a trench 2 having a desirable depth is formed in the semiconductor substrate 10, namely, in the major front surface 10a of the epitaxial substrate in which the N⁻ type silicon layer (epitaxial layer) 12 is formed on the N⁺ type silicon substrate 11, and the trench 2 is embedded by the P type epitaxial film (3), and then, an unnecessary epitaxial film (3) is polished so as to be removed. An anode electrode is formed on the major front surface 10a of the substrate 10, and a cathode electrode is formed on the rear surface 10b of the substrate 10.

Also, it should be understood that the conductivity types (N types and P types) indicated in FIG. 3 may be alternatively reversed.

Figure 4:
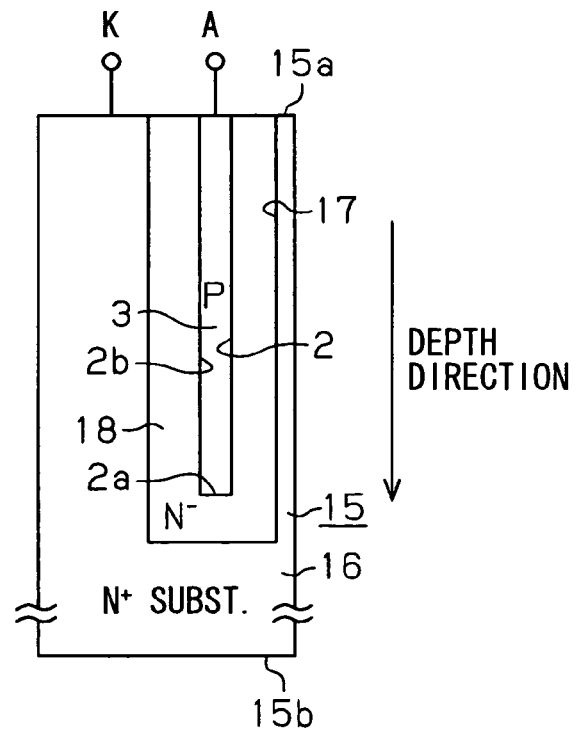
FIG. 4 is a cross sectional view showing a semiconductor device according to a modification of the second embodiment of the present invention.

FIG. 4 shows a longitudinal sectional view of a semiconductor device which may be replaced by that of FIG. 3.

In FIG. 4, a semiconductor substrate 15 functioning as a first conductivity type semiconductor substrate is constituted by an N⁺ type silicon substrate (first conductivity type substrate having high concentration) 16 and an N⁻ silicon layer (first conductivity type substrate having low concentration) 18, while the semiconductor substrate 15 owns a major front surface 15a and a rear surface 15b. The semiconductor substrate 15 has been formed by that a low concentration semiconductor layer forming trench 17 has been elongated from a major front surface of the N⁺ type silicon substrate 16 (namely, major front surface 15a of substrate 15) along the thickness direction thereof, and the N⁻ type silicon layer 18 has been formed within this trench 17. A diode forming-purpose trench 2 has been formed inwardly with respect to the N⁻ type silicon layer 18 within the trench 17. A trench 2 has been elongated from the major front surface 15a of the semiconductor substrate 15 along the thickness direction. A P type silicon layer 3 made of an epitaxial film has been formed within the trench 2. As a result, in an inner plane (bottom plane 2a and side plane 2b) of a trench 2 whose aspect ratio is larger than "1", the diode owns a PN junction constituted by the substrate 15 and the P type silicon layer 3. As a consequence, even under the high withstanding voltage, such a diode having a small area and a low resistance value can be realized.

Concentration of the N⁺ type silicon substrate 16 is $1\times10^{18}$ to $1\times10^{20}$ cm$^{-3}$. Concentration of the N⁻ type silicon layer (epitaxial layer) 18 is $1\times10^{14}$ to $1\times10^{18}$ cm$^{-3}$. Also, concentration of the P type silicon layer 3 is $1\times10^{14}$ to $1\times10^{20}$ cm$^{-3}$. A width of the trench 2 is 0.1 to 10 μm, and a depth of the trench 2 is 1 to 100 μm.

As to a manufacturing method, a trench 17 having a desirable depth is formed in an N⁺ type silicon substrate 16, and a desirable N⁻ type epitaxial film (18) and another desirable P type epitaxial film (3) are sequentially embedded in the trench 17, and then, an unnecessary epitaxial film is polished so as to be removed. Both an anode electrode and a cathode electrode are formed on the major front surface 15a of the substrate 15.

It should also be noted that the cathode electrode may be alternatively formed on the rear surface 15b of the substrate 15. Also, it should be understood that the conductivity types (N types and P types) indicated in FIG. 4 may be alternatively reversed.

Third Embodiment

Next, a third embodiment will now be described by mainly explaining a different point from that of the first and second embodiments.

Figure 5:
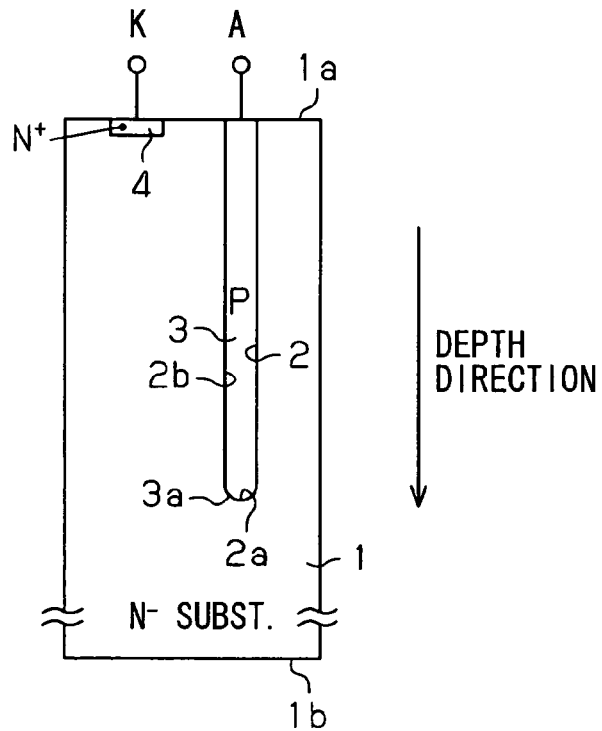
FIG. 5 is a cross sectional view showing a semiconductor device according to a third embodiment of the present invention.

FIG. 5 shows a longitudinal sectional view of a semiconductor device according to this third embodiment.

The technical different point from that of the first and second embodiments is given as follows: That is, a bottom portion of a P type silicon layer 3 is made in a round shape, namely made of a rounded structure.

In FIG. 5, the bottom portion 3a of the P type silicon layer 3 of FIG. 1 has been rounded. In other words, a bottom plane 2a of a trench 2 has been made round, and the bottom portion 3a of the P type silicon layer (second conductivity type semiconductor layer) 3 has been rounded. As a result, it is possible to suppress lowering of a withstanding voltage which is caused by concentration of electric fields in the bottom portion, so that a low resistance diode having a small area and a high withstanding voltage can be realized.

Concentration of the N⁻ type silicon substrate 1 is $1\times10^{14}$ to $1\times10^{18}$ cm$^{-3}$. Concentration of the P type silicon layer 3 is $1\times10^{14}$ to $1\times10^{20}$ cm$^{-3}$. A width of the trench 2 is 0.1 to 10 μm, and a depth of the trench 2 is 1 to 100 μm. An aspect ratio is larger than, or equal to "1."

As to a manufacturing method, a trench 2 having a desirable depth is formed in the substrate 1. Then, the bottom plane 2a of the trench 2 is rounded by executing either a high temperature annealing process or a chemical etching process at an unoxidizing atmosphere. Thereafter, the trench 2 is embedded by the P type epitaxial film (3). Furthermore, an unnecessary epitaxial film (3) is polished so as to be removed. Thereafter, a contact-purpose N⁺ type region 4 is formed in a major front surface 1a of the N⁻ type silicon substrate 1. Both an anode electrode and a cathode electrode are formed on the major front surface 1a of the substrate 1.

It should be understood that this structure may be alternatively applied to the structures of FIG. 2 to FIG. 4. Also, it should be noted that the conductivity types (N types and P types) indicated in FIG. 5 may be alternatively reversed.

Fourth Embodiment

Next, a fourth embodiment will now be described by mainly explaining a different point from that of the first, second, and third embodiments.

Figure 6:
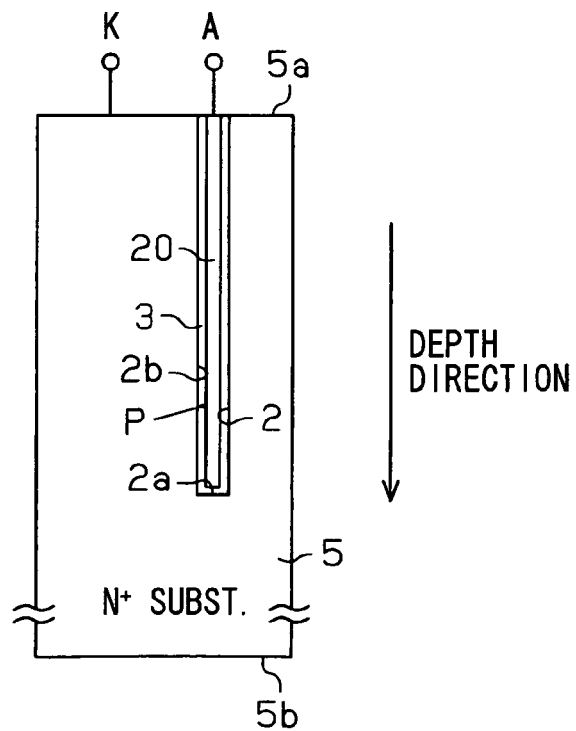
FIG. 6 is a cross sectional view showing a semiconductor device according to a fourth embodiment of the present invention.

FIG. 6 shows a longitudinal sectional view of a semiconductor device according to this fourth embodiment.

A different point from that of the first to third embodiments is given as follows: That is, a low resistance layer (20) has been embedded inwardly with respect to a P type silicon layer 3 within a trench 2.

In FIG. 6, a metal layer 20 functioning as the low resistance layer has been embedded inwardly with respect to the P type silicon layer 3 within the trench 2. In other words, the contact-purpose metal layer 20 has been embedded inwardly with respect to the P type silicon layer (second conductivity type semiconductor layer) 3 within the trench 2. As a result, it is possible to suppress local deviation of a current along the thickness direction of the substrate, so that a diode having a small area and a low resistance value can be realized.

Concentration of the N⁺ type silicon substrate 5 is $1\times10^{18}$ to $1\times10^{20}$ cm$^{-3}$. Concentration of the P type silicon layer 3 is $1\times10^{14}$ to $1\times10^{20}$ cm$^{-3}$. A width of the trench 2 is 0.1 to 10 μm, and a depth of the trench 2 is 1 to 100 μm. An aspect ratio is larger than, or equal to "1."

When the semiconductor device is manufactured, a trench 2 having a desirable depth is formed in the substrate 5, the trench 2 is embedded by the P type epitaxial film (3), and then, an unnecessary epitaxial film (3) is polished so as to be removed.

When electrodes are formed, a trench is again formed with respect to the epitaxial film (3) within the trench 2, a metal layer (metal film) 20 is embedded in this trench, and a pattern is formed. Both an anode electrode and a cathode electrode are formed in the major front surface 5a of the substrate 5. It should also be noted that the cathode electrode may be alternatively formed on the rear surface 5b of the substrate 5.

This structure may be alternatively applied to the structures of FIG. 1, and FIG. 3 to FIG. 5. Also, instead of the metal layer 20 as the low resistance layer, a P+ type silicon layer having high concentration may be alternatively employed. It should also be noted that the conductivity types (N types and P types) shown in FIG. 6 may be reversed.

Fifth Embodiment

Next, a fifth embodiment will now be described by mainly explaining a different point from that of the first embodiment.

Figure 7:
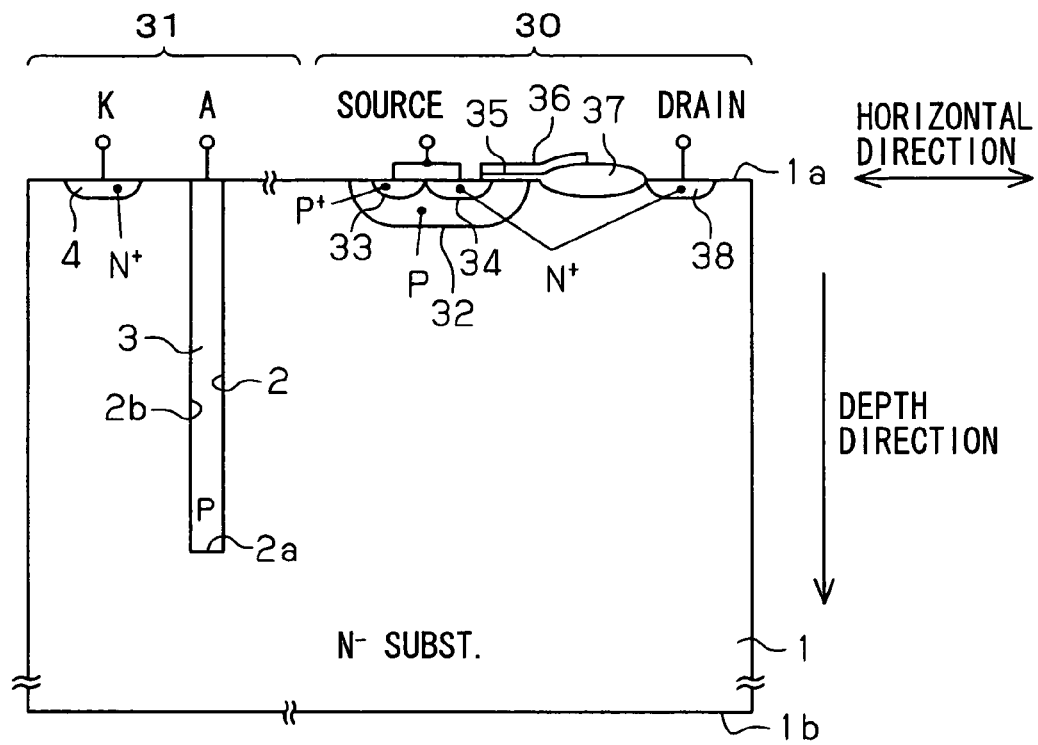
FIG. 7 is a cross sectional view showing a semiconductor device according to a fifth embodiment of the present invention.

FIG. 7 shows a longitudinal sectional view of a semiconductor device according to this fifth embodiment.

In a semiconductor device having an LDMOS (Lateral Double-diffused Metal Oxide Semiconductor) transistor 30 functioning as a semiconductor switching element as an internal element, a protection diode 31 is provided on the same chip, and the diode structure shown in FIG. 1 is employed as this protection diode 31. In other words, in FIG. 7, the LDMOS transistor 30 has been formed as the internal element in the substrate 1, and the protection diode 31 has been formed in this substrate 1. That is to say, the semiconductor device of the fifth embodiment corresponds to such a semiconductor device that both the semiconductor switching element (30) and the protection diode 31 for protecting this switching element (30) are manufactured in the form of a single chip.

In the LDMOS transistor 30, a P type region 32 has been formed in a major front surface 1a of an N− type silicon substrate 1, and also, a P+ type source contact region 33 and an N+ type source region 34 have been formed in a surface layer portion within the P type region 32. A gate electrode 36 has been formed via a gate oxide film 35 on the P type region 32. Furthermore, in the major front surface 1a of the N− type silicon substrate 1, an N+ type drain region 38 has been formed via an LOCOS oxide film 37 at a position separated from the P type region 32. A source electrode has been connected to both the P+ type source contact region 33 and the N+ type source region 34, whereas a drain electrode has been connected to the N+ type drain region 38.

The protection diode 31 is equivalent to that shown in the first embodiment. In other words, a trench 2 has been elongated along a thickness direction from a major front surface 1a in an N− type silicon substrate (first conductivity type semiconductor substrate) 1 having the above-described major front surface 1a and a rear surface 1b, and a P type silicon layer (second conductivity type semiconductor layer) 3 made of an epitaxial film has been formed in the trench 2. In an inner plane (bottom plane 2a and side plane 2b) of the trench 2 whose aspect ration is larger than "1", the protection diode has a PN junction constituted by the N− type silicon substrate 1 and the P type silicon layer 3. A contact-purpose N+ region 4 has been formed in the major front surface 1a of the substrate 1. An anode electrode has been connected to the P type silicon layer 3, and a cathode electrode has been connected to the contact-purpose N+ region 4. Apparently, a withstanding voltage value of the protection diode 31 has been set lower than, or equal to the withstanding voltage value of the internal element (30). In this semiconductor device, since the diode having the small area and the low resistance value is employed as the protection diode, an increase of the chip area can be suppressed.

At this time, plural pieces of the above-explained protection diodes 31 may be alternatively provided.

In a manufacturing method, the N+ type regions 34 and 38 of the LDMOS transistor 30, and the contact-purpose N+ region 4 of the protection diode 31 are manufactured in the same step. However, in order to secure the performance of the respective regions 34, 38, and 4, these regions may be separately manufactured, if necessary.

In this fifth embodiment, the third embodiment and the fourth embodiment may be alternatively applied. In other words, the bottom portion of the P type silicon layer 3 may be alternatively made in a round shape. In this alternative structure, concentration of currents caused by break down at the bottom portion can be released, so that the protection function of the protection diode may be improved. Alternatively, a contact-purpose low resistance layer may be embedded inwardly with respect to the P type silicon layer 3 within the trench 2. In this alternative case, local deviation of a current along the thickness direction of the substrate may be suppressed, so that the protection function of the protection diode can be improved.

Also, the N type, or P type of the diode may be alternatively reversed, depending upon the conductivity type of the substrate 1. At this time, all of the conductivity types (N types and P types) shown in FIG. 7 may be alternatively reversed.

Although the protection diode has been applied in such a bulk substrate as an N− type substrate in this fifth embodiment, the protection diode may be apparently applied to an SOI type substrate.

Also, in this fifth embodiment, as represented in the second embodiment of FIG. 3, the semiconductor substrate 10 is constituted by forming the first conductivity type epitaxial film (12) having the low concentration on the first conductivity type substrate 11 having the high concentration. The diode forming-purpose trench 2 may be alternatively formed in this epitaxial film (12). Alternatively, also in this fifth embodiment, as shown in FIG. 4, the semiconductor substrate 15 may be constituted by that a low concentration semiconductor layer forming-purpose trench 17 is elongated from the major front surface of the first conductivity type substrate 16 having the high concentration along the thickness direction, and the first conductivity type semiconductor layer (18) having the low concentration is formed within the trench 17, and also, the diode forming-purpose trench 2 is formed inwardly with respect to the semiconductor layer (18) within the trench 17. In this fifth embodiment, since the structure of the second embodiment (FIGS. 3 and 4) is employed, the protection diode can function as the high withstanding voltage protection diode.

Sixth Embodiment

Next, a sixth embodiment will now be described by mainly explaining a different point from that of the second embodiment.

Figure 8:
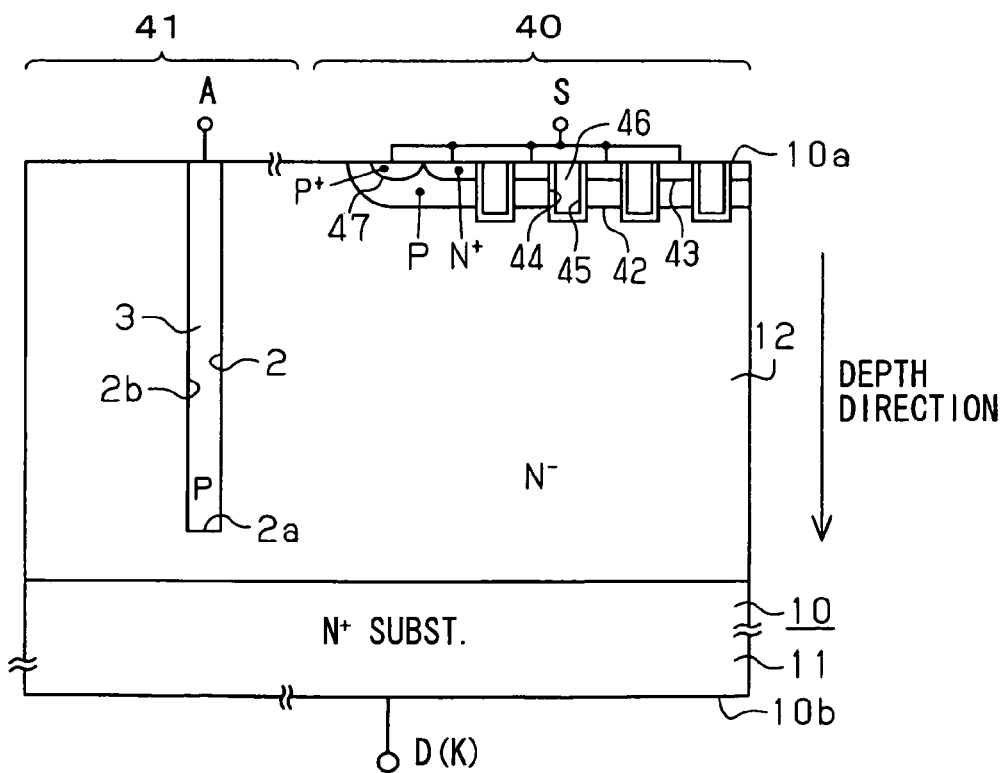
FIG. 8 is a cross sectional view showing a semiconductor device according to a sixth embodiment of the present invention.

FIG. 8 shows a longitudinal sectional view of a semiconductor device according to this sixth embodiment.

In a semiconductor device which contains a trench DMOS transistor 40 functioning as a semiconductor switching element as an internal element, a protection diode 41 is provided on the same chip, and the diode structure shown in FIG. 3 is employed as this protection diode 41.

In FIG. 8, a semiconductor substrate 10 is constituted by forming an N− type epitaxial film (12) on an N+ type silicon substrate 11. As to the trench DMOS transistor 40 corresponding to a lateral type DMOS transistor, a P type region 42 has been formed in a surface layer portion on a major front surface 10a (surface of $N^-$ type silicon layer 12) of the semiconductor substrate 10. An $N^+$ type source region 43 has been formed on the surface layer portion within the P type region 42. On the major front surface 10a (surface of $N^-$ type silicon layer 12) of the semiconductor substrate 10, a trench 44 has been formed in such a manner that this trench 44 penetrates through both the $N^+$ type source region 43 and the P type region 42. A gate electrode 46 has been embedded via a gate oxide film 45 within the trench 44. Also, a source contact-purpose $P^+$ type region 47 has been formed in the surface layer portion within the P type region 42. A source electrode has been connected to both the $N^+$ source region 43 and the source contact-purpose $P^+$ region 47, and also, a drain electrode has been connected to the $N^+$ type silicon substrate 11.

As to the protection diode 41, a trench 2 has been formed in the major front surface 10a (surface of $N^-$ type silicon layer 12) of the substrate 10 and a P type silicon layer 3 made of an epitaxial film has been formed in the trench 2. In an inner plane (bottom plane 2a and side plane 2b) of the trench 2 whose aspect ratio is larger than "1", the protection diode has a PN junction constituted by the substrate 10 ($N^-$ type silicon layer 12) and the P type silicon layer 3. An anode electrode has been connected to the P type silicon layer 3, and a cathode electrode (functioning also as drain electrode) has been connected to the $N^+$ type silicon substrate 11.

As explained above, the trench DMOS transistor 40 has been formed in the substrate 10 as an internal element and the protection diode 41 has been formed in the substrate 10. The protection diode 41 is equivalent to that shown in the second embodiment. Apparently, a withstanding voltage value of the protection diode 41 has been set lower than, or equal to the withstanding voltage value of the internal element (40). Alternatively, a plurality of the protection diodes 41 may be provided.

In this sixth embodiment, the third embodiment and the fourth embodiment may be applied. That is, the bottom plane 2a of the trench 2 may be alternatively made circular, and the bottom portion of the P type silicon layer 3 may be alternatively made in a round shape. In this alternative structure, concentration of currents caused by break down at the bottom portion can be relaxed, so that the protection function of the protection diode may be improved. Alternatively, a contact-purpose low resistance layer may be embedded inwardly with respect to the P type silicon layer 3 within the trench 2. In this alternative case, local deviation of a current along the thickness direction of the substrate may be suppressed, so that the protection function of the protection diode can be improved.

Alternatively, the internal element may be realized as a planer DMOS transistor, a concave DMOS transistor, and the like.

Also, the conductivity types (N types and P types) shown in FIG. 8 may be alternatively reversed.

Seventh Embodiment

Next, a seventh embodiment will now be described by mainly explaining a different point from that of the second embodiment.

Figure 9:
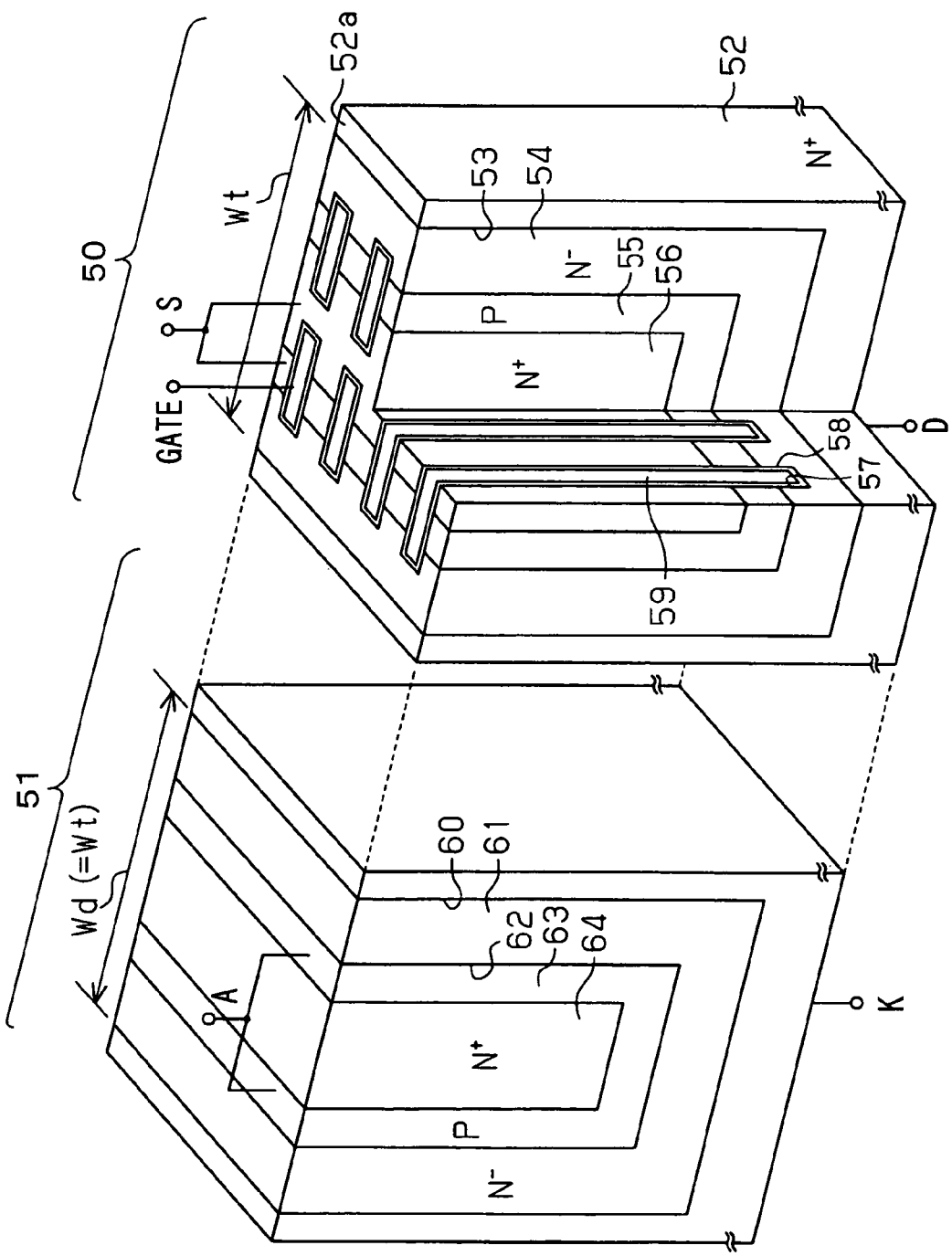
FIG. 9 is a perspective view showing a semiconductor device according to a seventh embodiment of the present invention.
Figure 10A:
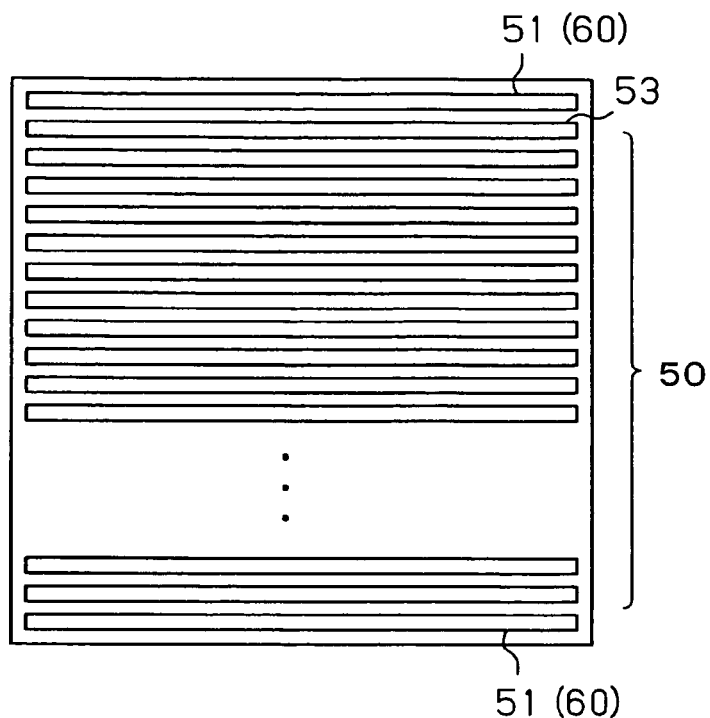
FIG. 10A is a plan view showing the semiconductor device according to the seventh embodiment of the present invention.
Figure 10B:
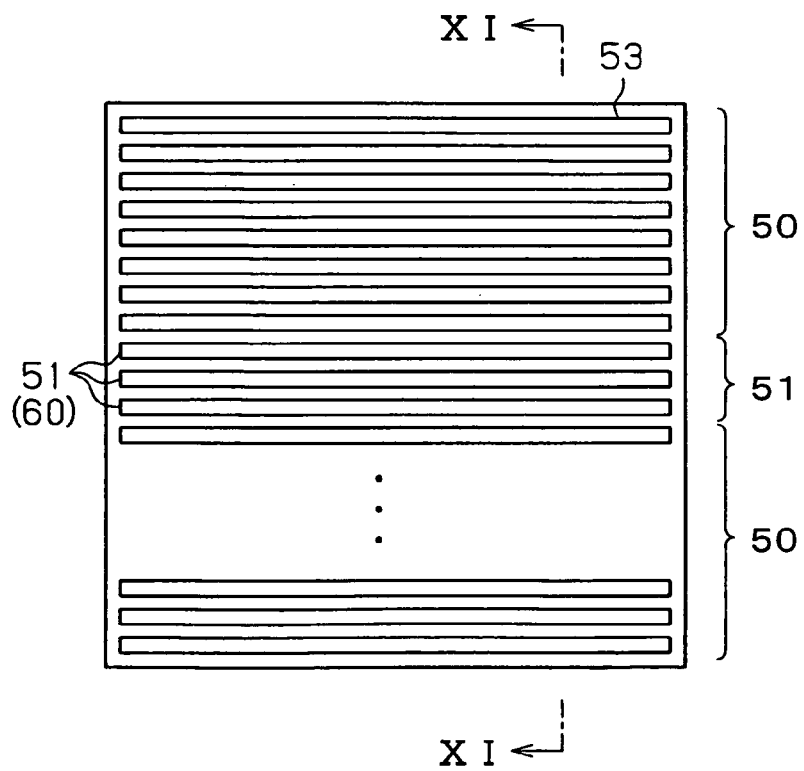
FIG. 10B is a plan view showing another semiconductor device according to a modification of the seventh embodiment of the present invention.
Figure 11:
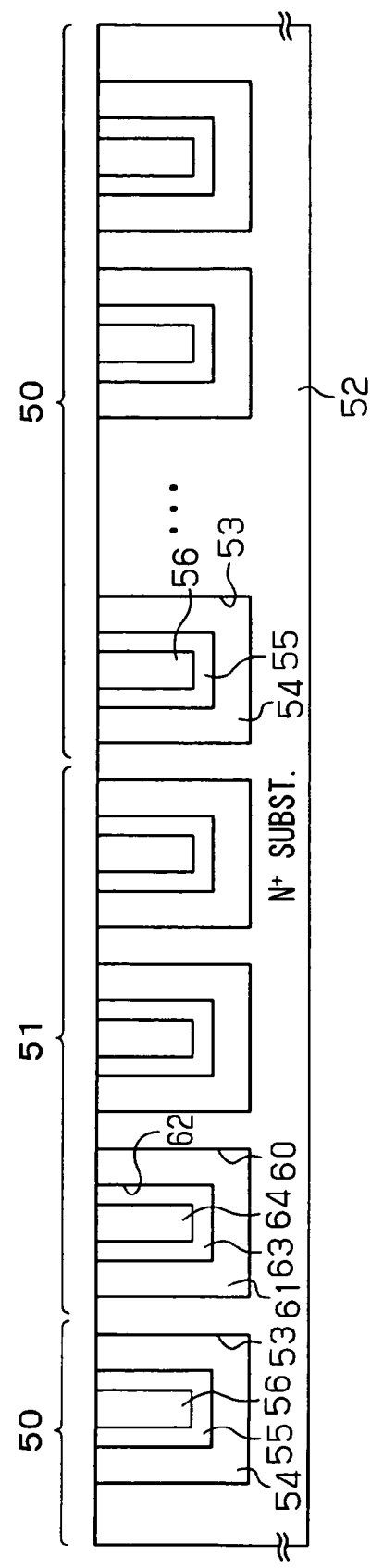
FIG. 11 is a cross sectional view showing the device taken along line XI-XI in FIG. 10B.

FIG. 9 shows a longitudinal sectional view of a semiconductor device according to this seventh embodiment. FIGS. 10A and 10B show an example as to plan views (layouts) of chips in the semiconductor device indicated in FIG. 9. FIG. 11 is a sectional view of the chip (namely, sectional view of trench and epitaxial film portion), taken along a line XI-XI of FIG. 10B.

In FIG. 9, in a semiconductor device which has a three-dimensional MOSFET 50 functioning as a semiconductor switching element as an internal element, a protection diode 51 is provided on the same chip, and the diode structure shown in FIG. 4 is employed as this protection diode 51. In other words, the internal element corresponds to the three-dimensional power MOSFET 50, and the protection diode 51 is equivalent to that of the second embodiment. As described above, both the three-dimensional power MOSFET 50 functioning as the semiconductor switching element, and the protection diode 51 which protects this three-dimensional power MOSFET 50 are manufactured in a single chip of the semiconductor.

The three-dimensional power MOSFET 50 owns the below-mentioned structure. A first trench 53 has been dug from a major front surface 52a in an $N^+$ type silicon substrate (first conductivity type semiconductor substrate) 52 which constitutes a drain region. A plane shape of this trench 53 constitutes a band shape which is elongated in a straight line (refer to FIGS. 10A and 10B). In an inner plane of the first trench 53, an $N^-$ type drift-purpose silicon layer (first conductivity type drift-purpose semiconductor layer having low concentration) 54 has been formed. A P type base-purpose silicon layer (second conductivity type base-purpose semiconductor layer) 55 has been formed inwardly with respect to the $N^-$ type drift-purpose silicon layer 54 within the first trench 53. An $N^+$ type source-purpose silicon layer (first conductivity type source-purpose semiconductor layer) 56 has been formed inwardly with respect to the P type base-purpose silicon layer 55 within the first trench 53. A source electrode has been connected to both the P type base-purpose silicon layer 55 and the $N^+$ source-purpose silicon layer 56. A second trench 57 has been dug from the major front surface 52a of the $N^+$ type silicon layer 52 in the first trench 53. The second trench 57 has been formed in such a manner that this second trench 57 penetrates through the P type base-purpose silicon layer 55 between the $N^+$ type source-purpose silicon layer 56 and the $N^-$ type drift-purpose silicon layer 54 in a direction directed from the $N^+$ type source-purpose silicon layer 56 to the $N^-$ type drift-purpose silicon layer 54 as the plane structure thereof. In an inner plane of the second trench 57, a gate electrode 59 has been formed via a gate oxide film (gate insulating film) 58 in the inner plane of the second trench 57. A drain electrode has been connected to the $N^+$ silicon substrate 52.

Then, when a transistor is turned ON, an inverting layer is formed at a portion in the P type base-purpose silicon layer 55, which is located opposite to the gate electrode 59. As a result, a current flows from the $N^+$ type source-purpose silicon layer 56 via a portion (inverting layer) in the P type base-purpose silicon layer 55, located opposite to the gate electrode 59, to the $N^-$ type drift-purpose silicon layer 54 and the $N^+$ type silicon substrate 52 corresponding to a drain region. At this time, the inverting layer is formed from the substrate surface to a deep portion separated from the substrate surface, so that an ON resistance value can be decreased.

As to the protection diode 51, a first conductivity type semiconductor substrate which constitutes the diode is constituted by the $N^+$ type silicon substrate 52 and an $N^-$ type silicon layer (first conductivity type semiconductor layer having low concentration) 61, and has a major front surface 52a and a rear surface. This semiconductor substrate has been constituted by that a low concentration semiconductor layer forming-purpose trench 60 is elongated from the major front surface 52a of the N+ silicon substrate 52 along the thickness direction, and an N− type silicon layer 61 is formed inside the trench 60. A plane shape of the trench 60 has a band shape which is elongated in a straight line (refer to FIGS. 10A and 10B). A diode forming-purpose trench 62 has been elongated inwardly with respect to the N− type silicon layer 61 within the trench 60 from the major front surface 52a of the N+ type silicon substrate 52 along the thickness direction. A P type silicon layer (second conductivity type semiconductor layer) 63 made of an epitaxial film has been formed in the trench 62. In an inner plane (bottom plane and side plane) of trench 62 whose aspect ratio is larger than "1", the protection diode owns a PN junction constituted by the N type silicon substrates (61 and 52), and the P type silicon layer 63. An N+ type silicon layer 64 has been embedded inwardly with respect to the P type silicon layer 63 within the trench 60. An anode electrode has been connected to the P type silicon layer 63, and a cathode electrode has been connected to the N+ type silicon substrate 52. Apparently, a withstanding voltage value of the protection diode 51 has been set lower than, or equal to the withstanding voltage value of the internal element (50).

An N+ type silicon layer 64 located at a center within the trench 60 in the protection diode 51 may be short circuited to the anode electrode if the protection capability of the diode can be sufficiently secured. However, generally speaking, since a stray NPN operation is suppressed, it is preferable that this N+ type silicon layer 64 may be set to be a floating condition.

In FIG. 10A, in the semiconductor chip, the protection diode 51 has been arranged outside the three-dimensional power MOSFET 50. In FIG. 10A, one piece of the trench 60 of the protection diode 51 has been formed per 1 edge of the chip. In this case, plural pieces of the trenches 60 of the protection diode 51 may be arranged per 1 edge of the chip. Otherwise, as shown in FIG. 10B, in the semiconductor chip, while considering that the source electrode of the three-dimensional power MOSFET 50 is short circuited to the anode electrode of the protection diode 51, the protection diode 51 may be arranged within this chip.

Also, the trench 60 of the protection diode 51 and the first trench 53 of the three-dimensional power MOSFET 50 are manufactured in the same step. In FIG. 11, both the three-dimensional power MOSFET 50 and the protection diode 51 own the same trenches (depths, widths, and lengths), and further, the same epitaxial films have been stacked. In other words, as shown in FIG. 9, a width "Wt" of the trench 53 of the three-dimensional power MOSFET 50, and a width "Wd" of the trench 60 of the protection diode 51 are made in the same sizes (Wd=Wt). Also, the low concentration semiconductor layer forming-purpose trench 60 of the protection diode 51 and the first trench 53 of the three-dimensional power MOSFET 50 have the same depths. Also, the N− type silicon layer (first conductivity type semiconductor layer having low concentration) 61 in the protection diode 51 has been constituted by the same epitaxial film as that of the N− type drift-purpose silicon layer 54. Also, the P type silicon layer (second conductivity type semiconductor layer) 63 in the protection diode has been constituted by the same epitaxial film as that of the P type base-purpose silicon layer 55. As a consequence, in the three-dimensional power MOSFET, an increase of the chip area caused by the protection diode 51 can be suppressed, and also, such a chip can be realized that in the manufacturing method, the manufacturing steps for forming the protection diode do not become complex.

Manufacturing method will be described in detail. An N+ substrate 52 is prepared. Trenches 53 and 60 are formed in desired regions of the three-dimensional power MOSFET and the protection diode respectively at the same time. Thereafter, epitaxial films (54, 61) and epitaxial films (55, 63) are formed at the same time. Therefore, the epitaxial films (54, 61) are identical with the epitaxial films (55, 63). That is to say, the low concentration semiconductor layer forming-purpose trench 60 is formed in the protection diode forming region at the same time when the first trench 53 is formed in the three-dimensional power MOSFET forming region (first step). The N− silicon layer (first conductivity semiconductor layer having low concentration) 61 made of an epitaxial film is formed within the low concentration semiconductor layer forming-purpose trench 60 in the protection diode forming region at the same time when the N− silicon layer (first conductivity drift-purpose semiconductor layer) 54 made of an epitaxial film is formed within the first trench 53 in the three-dimensional power MOSFET forming region (second step). The P type silicon layer (second conductivity semiconductor layer) 63 made of an epitaxial film is formed inwardly with respect to the N− type silicon layer (first conductivity type semiconductor layer having low concentration) 61 within the trench 60 in the protection diode forming region at the same time when the P type base-purpose silicon layer (second conductivity base-purpose semiconductor layer) 55 made of an epitaxial film is formed inwardly with respect to the drift-purpose silicon layer 54 in the first trench 53 in the three-dimensional power MOSFET forming region (third step). As a consequence, in the three-dimensional power MOSFET, such a chip capable of suppressing the increase of the chip area caused by the protection diode 51 can be manufactured, while the steps for forming the protection diode are not made complex.

As previously explained in the third embodiment, also in this seventh embodiment, a bottom plane of a trench may be made circular, and the bottom portion of the P type silicon layer (second conductivity type semiconductor layer) 63 may be formed in a round shape. In this alternative case, apparently, the three-dimensional power MOSFET 50 may become the similar shape. Furthermore, as previously explained in the fourth embodiment, in this seventh embodiment, a contact-purpose low resistance layer may be alternatively embedded inwardly with respect to the P type silicon layer (second conductivity type semiconductor layer) 63 within the trench 62.

Also, it should be understood that the conductivity types (N types and P types) indicated in FIG. 9 may be alternatively reversed.

Eighth Embodiment

Next, an eighth embodiment will now be described by mainly explaining a different point from that of the seventh embodiment.

Figure 12:
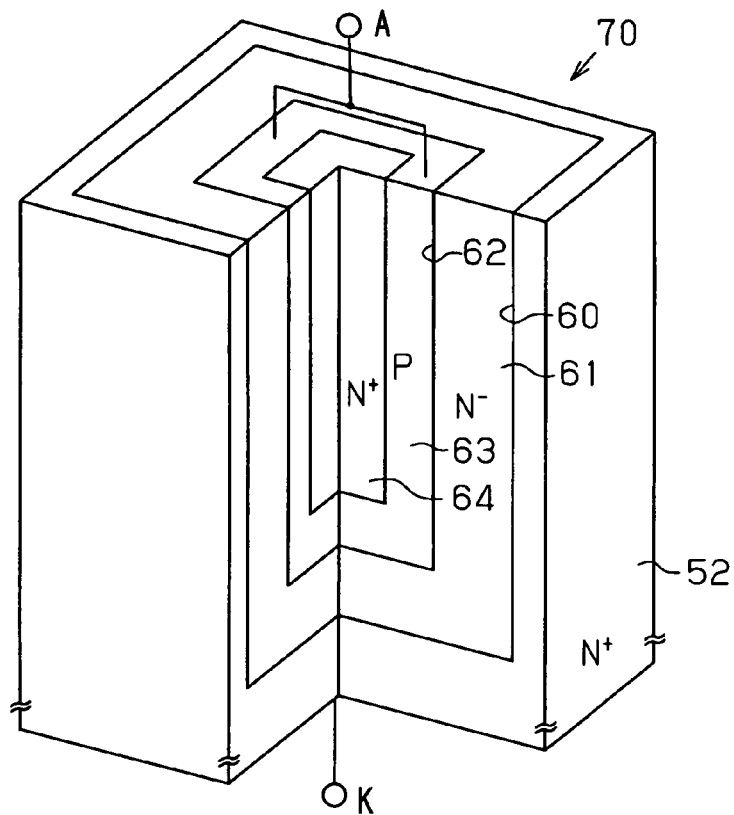
FIG. 12 is a perspective view showing a semiconductor device according to an eighth embodiment of the present invention.
Figure 13:
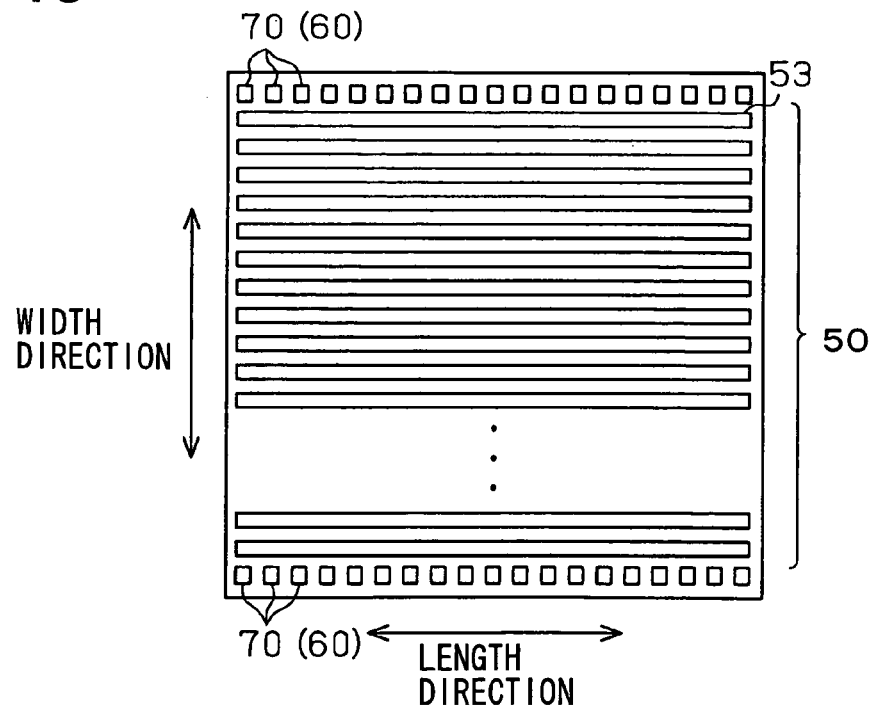
FIG. 13 is a plan view showing the semiconductor device according to the eighth embodiment of the present invention.

FIG. 12 shows a longitudinal sectional view of a semiconductor device according to this eighth embodiment. FIG. 13 is a plan view for showing a chip.

This eighth embodiment owns such a different point that a layout shape of a protection diode formed on the same chip as a three-dimensional power MOSFET thereof is different from the layout of the seventh embodiment.

In FIG. 12, as to a protection diode 70 according to this eighth embodiment, a plane shape of a low concentration semiconductor layer forming-purpose trench 60 is substantially equal to a square (plane shape of diode forming-purpose trench 62 is also substantially equal to square).

As indicated in FIG. 13, a plurality of these protection diodes 70 have been arranged in a repetition manner along two edges located opposite to each other in the chip (namely, arranged outside three-dimensional power MOSFET 50).

A width of a trench 60 as to one protection diode 70 is equal to a width of a trench 53 of the three-dimensional power MOSFET 50, and lengths of the trenches 60 and 53 are different rectangular shapes from each other. Apparently, a withstanding voltage value of the protection diode 70 has been set to be lower than, or equal to the withstanding voltage value of the internal element (50).

The trench 60 of the protection diode 70 and epitaxial films (61, 63, 64) have been formed in the same step as the trench 53 and the epitaxial films (54, 55, 56) of the three-dimensional power MOSFET 50 of FIG. 9.

It should be understood that as to the protection diode 70, if the width of the trench is equal to the three-dimensional power MOSFET 50, then the plane shape of the trench may be made in a circular shape, or a polygon shape.

In this eighth embodiment, the third embodiment and the fourth embodiment may be alternatively applied. In other words, the bottom portion of the P type silicon layer 63 may be alternatively made in a round shape, and a low resistance layer may be alternatively embedded in the P type silicon layer 63. Similar to the seventh embodiment, as compared with the structure of FIG. 13, in such a case that a source electrode of the three-dimensional power MOSFET 50 is shortcircuited to an anode electrode of the protection diode 70, as explained in FIG. 10B, the protection diode 70 may be alternatively arranged inside the chip.

Ninth Embodiment

Next, a ninth embodiment will now be described by mainly explaining a different point from that of the seventh embodiment.

Figure 14:
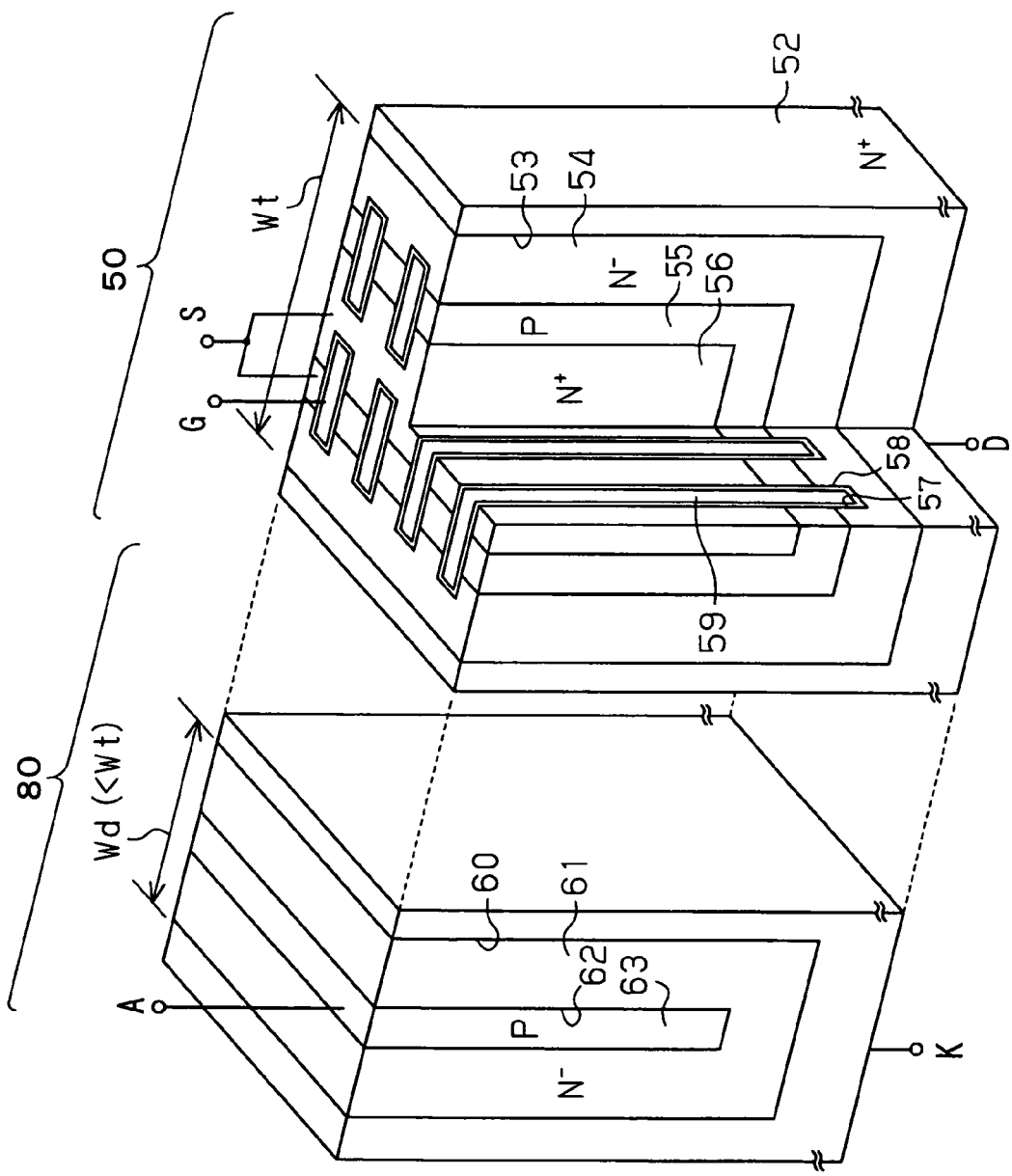
FIG. 14 is a perspective view showing a semiconductor device according to a ninth embodiment of the present invention.
Figure 15A:
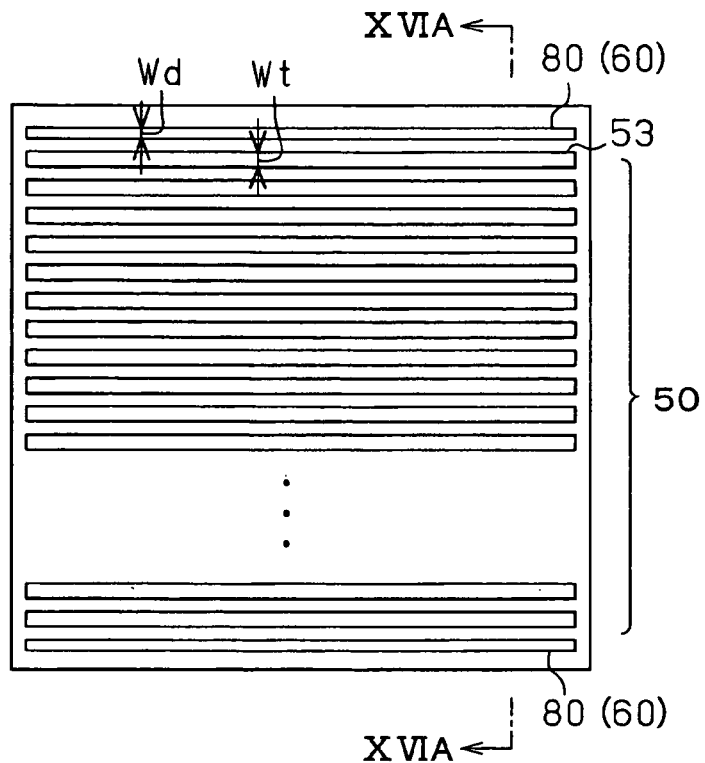
FIG. 15A is a plan view showing the semiconductor device according to the ninth embodiment of the present invention.
Figure 15B:
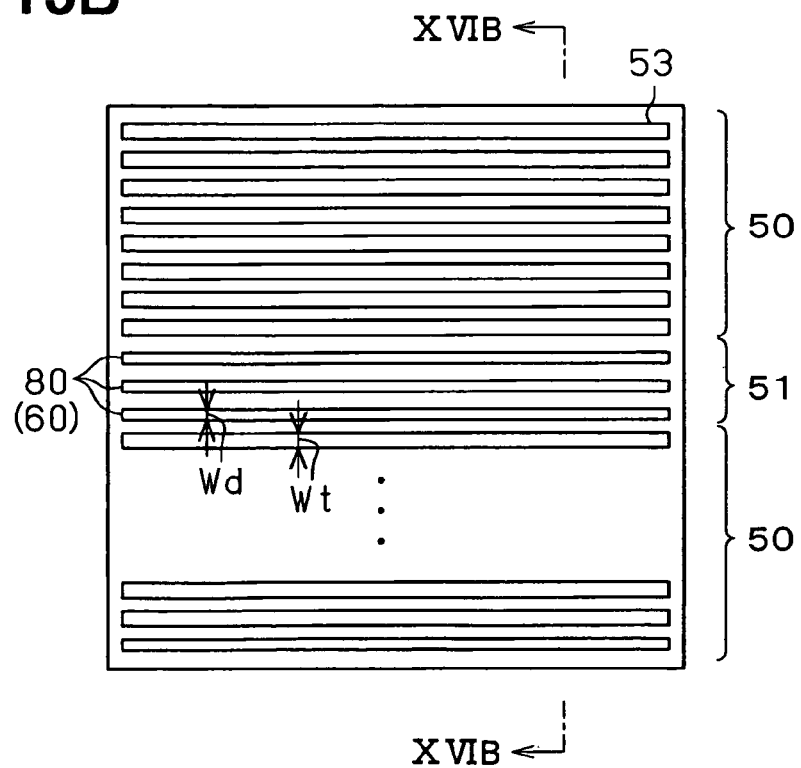
FIG. 15B is a plan view showing another semiconductor device according to a modification of the ninth embodiment of the present invention.

FIG. 14 shows a longitudinal sectional view of a semiconductor device according to this ninth embodiment. FIGS. 15A and 15B show an example as to plan views (layouts in chips) of the semiconductor device indicated in FIG. 14. FIG. 16A is a sectional view of the chip (namely, sectional view of trench and epitaxial film portion), taken along a line XVIA-XVIA of FIG. 15A. FIG. 16B is a sectional view of the chip (namely, sectional view of trench and epitaxial film portion), taken along a line XVIB-XVIB of FIG. 15B.

A protection diode 80 of this ninth embodiment owns the below-mentioned different point from the protection diode of the seventh embodiment. That is, a width of a first trench 53 of a three-dimensional power MOSFET 50 is different from a width of a trench 60 of a protection diode 80, namely, the width "Wd" of the trench 60 in the protection diode 80 is made narrower than the width "Wt" of the first trench 53 in the three-dimensional power MOSFET 50 (Wd<Wt). Apparently, a withstanding voltage value of the protection diode 80 has been set to be lower than a withstanding voltage of an internal element (50).

In FIG. 15A, in the semiconductor chip, the protection diode 80 has been arranged outside the three-dimensional power MOSFET 50. Otherwise, as shown in FIG. 15B, in the semiconductor chip, while considering that the source electrode of the three-dimensional power MOSFET 50 is shortcircuited to the anode electrode of the protection diode 80, the protection diode 80 may be arranged within this chip.

The trenches and the epitaxial films of the three-dimension power MOSFET 50 and the protection diode 80 have been manufactured in the same step. In this case, since the trench width of the protection diode 80 is narrower, as shown in FIG. 14, an epitaxial film equivalent to the N⁺ type source-purpose silicon layer 56 is not formed in a protection diode portion.

As a consequence, forming of the same epitaxial film as that of the N⁺ type source-purpose silicon layer 56 within the low concentration semiconductor layer forming-purpose trench 60 in the protection diode 80 is reduced, or suppressed, so that the protection function of the protection diode 80 can be improved.

As previously explained in the third embodiment, also in this ninth embodiment, a bottom plane of a trench 62 may be made circular, and the bottom portion of the P type silicon layer (second conductivity type semiconductor layer) 63 may be formed in a round shape. In this alternative case, apparently, the three-dimensional power MOSFET 50 may become the similar shape. Furthermore, as previously explained in the fourth embodiment, in this ninth embodiment, a contact-purpose low resistance layer may be alternatively embedded inwardly with respect to the P type silicon layer (second conductivity type semiconductor layer) 63 within the trench 62.

Also, it should be understood that the conductivity types (N types and P types) indicated in FIG. 14 may be alternatively reversed.

Tenth Embodiment

Next, a tenth embodiment will now be described by mainly explaining a different point from that of the ninth embodiment.

Figure 17:
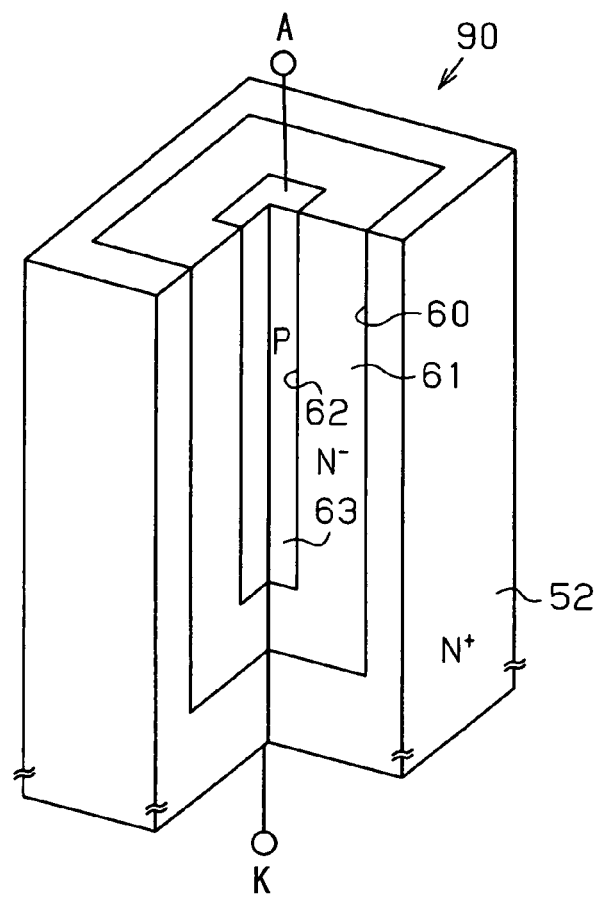
FIG. 17 is a perspective view showing a semiconductor device according to a tenth embodiment of the present invention.
Figure 18:
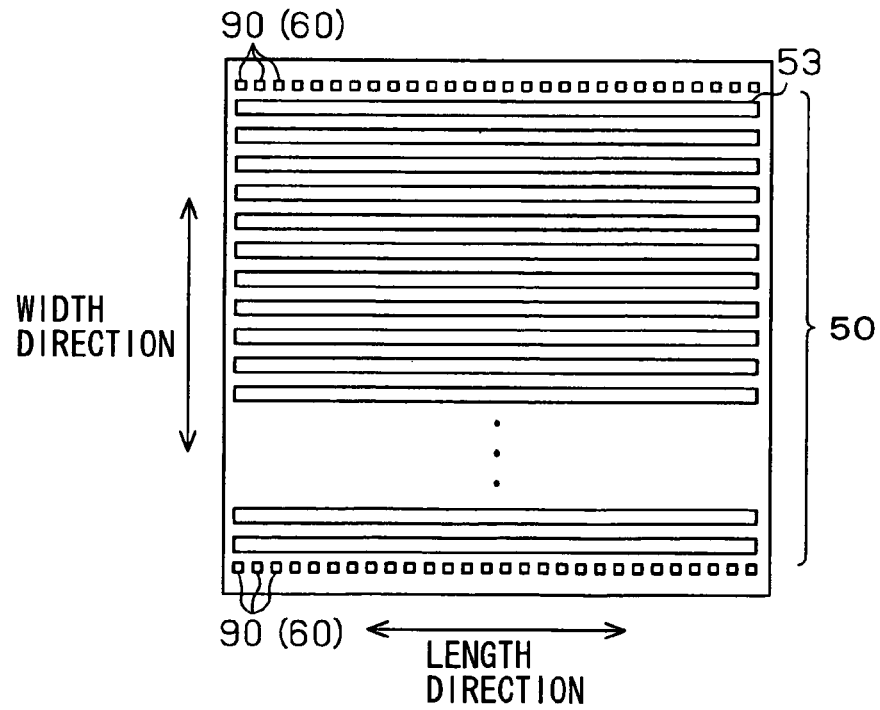
FIG. 18 is a plan view showing the semiconductor device according to the tenth embodiment of the present invention.

FIG. 17 shows a longitudinal sectional view of a semiconductor device according to this tenth embodiment. FIG. 18 is a plan view (layout in chip) of the semiconductor device shown in FIG. 17.

This tenth embodiment owns such a different point from the ninth embodiment that a layout shape of a protection diode 90 formed on the same chip with a three-dimensional power MOSFET 50 is different from that of the ninth embodiment.

As shown in FIGS. 17 and 18, one protection diode 90 is made in a rectangular shape, while not only a trench width of this protection diode 90 but also a trench length thereof are different from those of the three-dimensional power MOSFET 50. Then, as shown in the plan view of FIG. 18, plural pieces of the protection diodes 90 have been arranged in a repetition manner outside the three-dimensional power MOSFET 50 on the chip. Apparently, a withstanding voltage value of the protection diode 90 has been set to be lower than, or equal to the withstanding voltage value of the internal element (50). It should also be noted that as compared with the structure of FIG. 18, similar to the ninth embodiment, in such a case that the source electrode of the three-dimensional power MOSFET 50 is shortcircuited to the anode electrode of the protection diode 90, the protection diode 90 may be arranged within this chip.

The trench 60 of the protection diode 90 and epitaxial films (N⁻ type silicon layer 61, and P type silicon layer 63) have been formed in the same step as the three-dimensional power MOSFET 50.

Plane shapes of the trenches (60, 62) of the protection diode 90 may be alternatively made in circular shapes, or polygon shapes.

As previously explained in the third embodiment, also in this tenth embodiment, a bottom plane of a trench 62 may be made circular, and the bottom portion of the P type silicon layer (second conductivity type semiconductor layer) 63 may be formed in a round shape. Furthermore, as previously explained in the fourth embodiment, in this tenth embodiment, a contact-purpose low resistance layer may be alternatively embedded inwardly with respect to the P type silicon layer (second conductivity type semiconductor layer) 63 within the trench 62.

Eleventh Embodiment

Next, an eleventh embodiment will now be described by mainly explaining a different point from that of the first embodiment.

Figure 19:
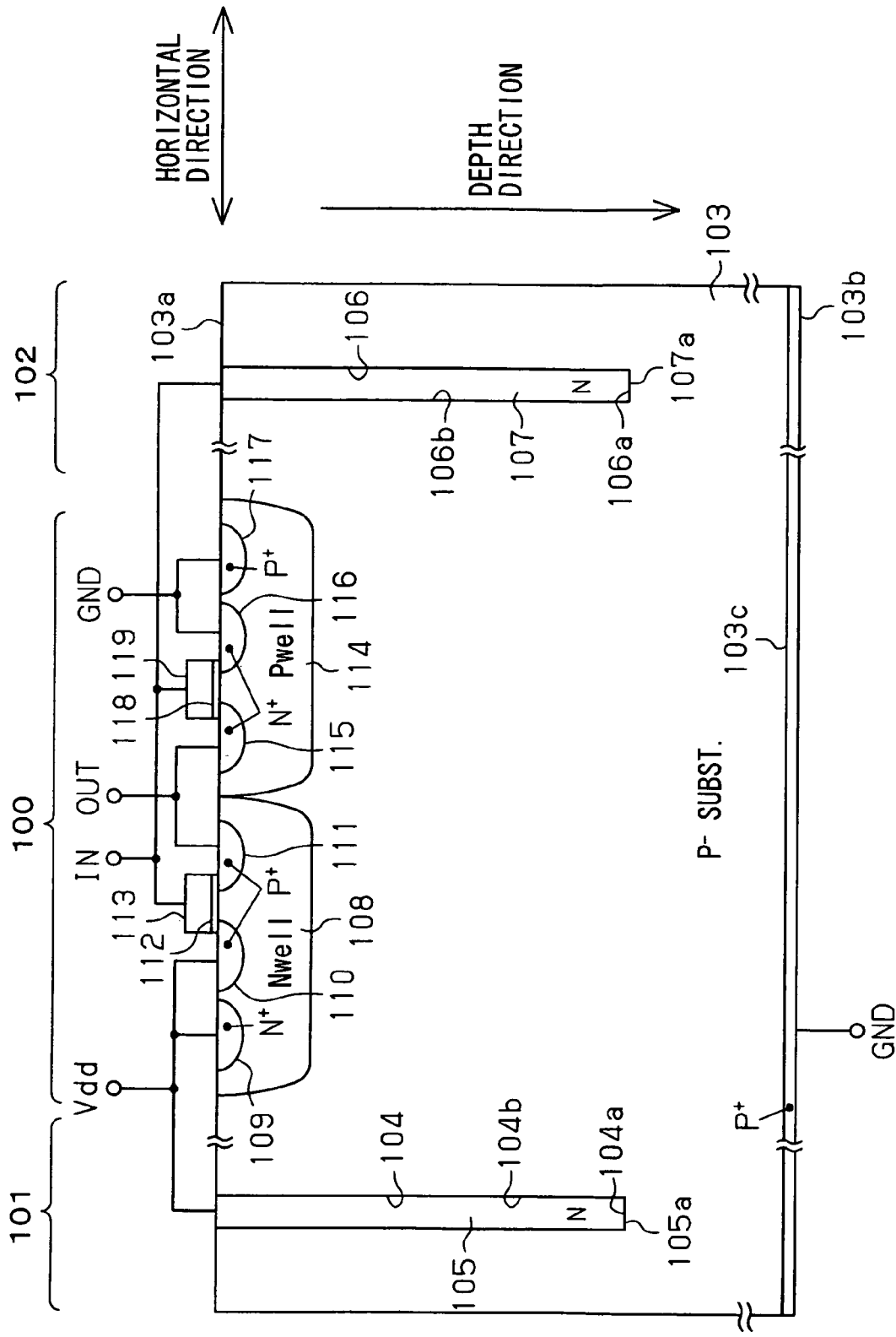
FIG. 19 is a cross sectional view showing a semiconductor device according to an eleventh embodiment of the present invention.

FIG. 19 shows a longitudinal sectional view of a semiconductor device according to this 11-th embodiment.

In a semiconductor device having a CMOS inverter 100 functioning as a semiconductor integrated circuit as an internal element, both a power supply protection diode 101 and a gate protection diode 102 have been provided on the same chip, and these protection diodes 101 and 102 have employed the diode structure shown in FIG. 1. In other words, in this semiconductor device, the CMOS inverter 100 functioning as the semiconductor integrated circuit, and the protection diodes 101 and 102 which protect this CMOS inverter 100 have been manufactured in a single chip.

A P⁻ type silicon substrate (first conductivity type semiconductor substrate) 103 has a major front surface 103*a* and a rear surface 103*b*. The semiconductor integrated circuit constructed of the CMOS inverter 100 owns a power supply terminal (Vdd) functioning as an external connecting terminal, a ground terminal (GND), a signal input terminal (IN), and a signal output terminal (OUT). On the major front surface 103*a* of the P⁻ type silicon substrate 103, both an N type well layer 108 and a P type well layer 114 have been formed in a surface layer portion thereof. A contact-purpose N⁺ type region 109, a P⁺ type region 110, and a P⁺ type region 111 have been formed in the surface layer portion of the N type well layer 108, while a gate electrode 113 has been formed via a gate oxide film (gate insulating film) 112 between the P⁺ type region 110 and the P⁺ type region 111. An N⁺ type region 115, an N⁺ type region 116, and a contact-purpose P⁺ type region 117 have been formed in the surface layer portion of the P type well layer 114, while a gate electrode 119 has been formed via a gate oxide film (gate insulating film) 118 between the N⁺ type region 115 and the N⁺ type region 116. Both the contact-purpose N⁺ type region 109 and the P⁺ type region 110 have been connected to the power supply terminal (Vdd). Both the N⁺ type region 116 and the contact-purpose P⁺ type region 117 have been connected to the ground terminal (GND). Both the P⁺ type region 111 and the N⁺ type region 115 have been connected to the signal output terminal (OUT). Both the gate electrode 113 and the gate electrode 119 have been connected to the signal input terminal (IN).

Also, as to the protection diodes 101 and 102, diode forming-purpose trenches 104 and 106 have been elongated from the major front surface 103*a* of the substrate 103 along the thickness direction, and N type silicon layers (second conductivity type semiconductor layers) 105 and 107 made of epitaxial films have been formed in the trenches 104 and 106. In inner planes (104*a*, 104*b*, 106*a*, and 106*b*) of the trenches 104 and 106 whose aspect ratios are larger than "1", the protection diodes own PN junctions constituted by the P⁻ type substrate 103 and the N type silicon layers 105 and 107. The N type silicon layer 105 on the cathode side has been connected to the power supply terminal (Vdd). Also, the N type silicon layer 107 on the cathode side has been connected to the signal input terminal (gate electrode of internal terminal). The P⁻ type silicon substrate 103 on the anode side has been grounded via a contact-purpose P⁺ type region 103*c* on the rear surface of the substrate 103.

As a consequence, since diodes having small areas and low resistance values are employed as the protection diodes 101 and 102, an increase of the chip area can be suppressed.

In FIG. 19, one piece of the power supply protection diode 101 and one piece of the gate protection diode 102 have been provided. Alternatively, plural pieces of these protection diodes 101 and 102 may be employed.

Alternatively, the third embodiment and the fourth embodiment may be applied to this 11-th embodiment. In other words, bottom planes 104*a* and 106*a* of the trenches 104 and 106 are made circular, and bottom portions 105*a* and 107*a* of the N type silicon layers 105 and 107 are formed in round shapes. Also, contact-purpose low resistance layers are embedded inwardly with respect to the N type silicon layers 105 and 107 within the trenches 104 and 106.

Figure 20:
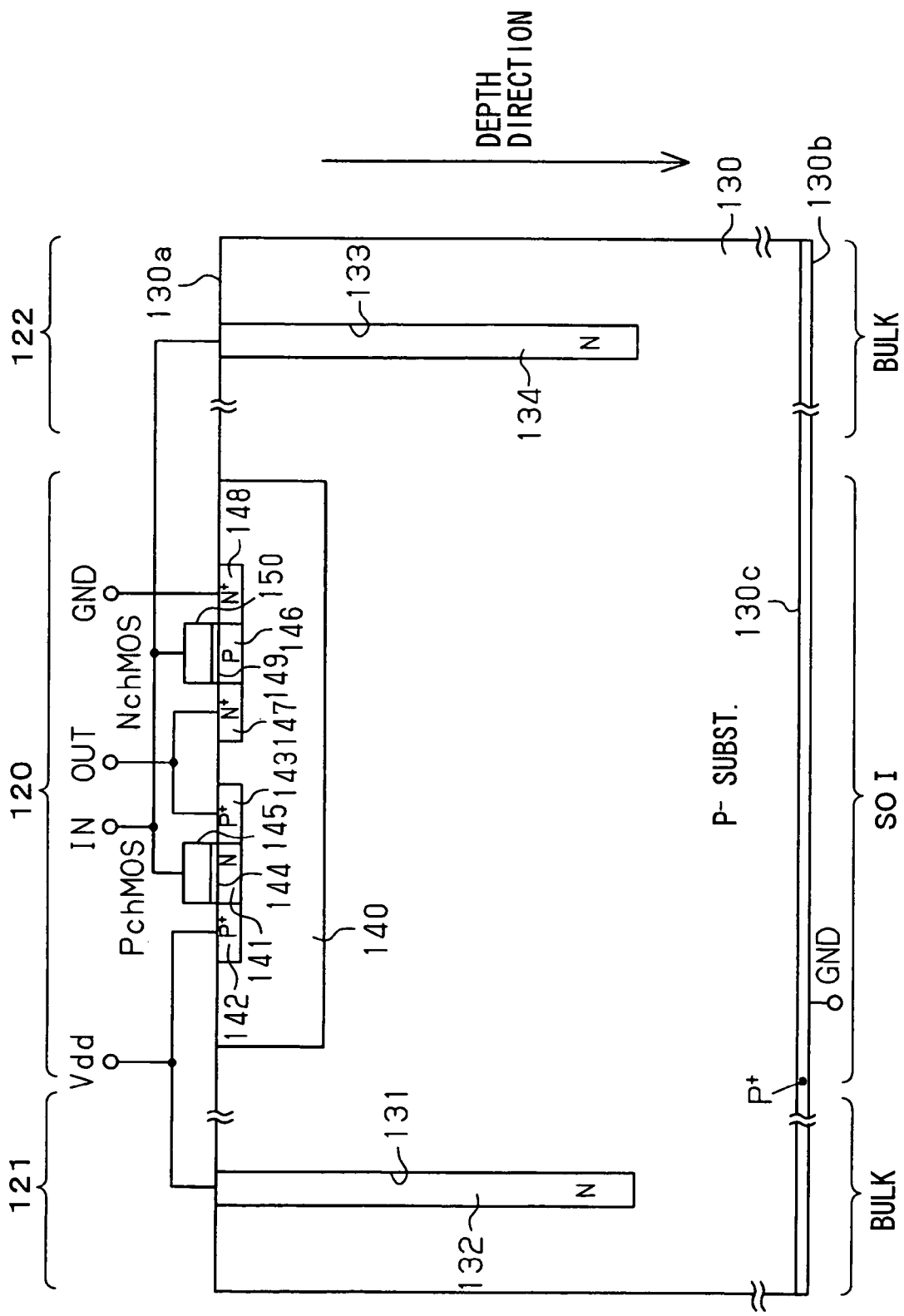
FIG. 20 is a cross sectional view showing a semiconductor device according to a modification of the eleventh embodiment of the present invention.

Also, as shown in FIG. 20, the 11-th embodiment may be alternatively applied to a partial SOI type substrate. In this alternative case, the CMOS inverter 120 functioning as the internal element may be formed in the SOI region, and protection diodes 121 and 122 may be formed in a bulk region.

Precisely speaking, as to the COMOS inverter 120 functioning as the inner element, an embedded insulating film 140 has been formed on the side of a major front surface 130*a* of a P⁻ type silicon substrate 130 in such a manner that the embedded insulating film 140 surrounds a thin-film silicon layer, and both a P channel MOS transistor and an N channel MOS transistor have been formed in the thin-film silicon layer. As to the P channel MOS transistor, an N type region 141, a P⁺ type region 142, and a P⁺ type region 143 have been formed in the thin-film silicon layer; and also, a gate electrode 145 has been formed via a gate oxide film (gate insulating film) 144 on the thin-film silicon layer. As to the N channel MOS transistor, a P type region 146, an N⁺ type region 147, and an N⁺ type region 148 have been formed in the thin-film silicon layer; and also, a gate electrode 150 has been formed via a gate oxide film (gate insulating film) 149 on the thin-film silicon layer. The P⁺ type region 142 has been connected to the power supply terminal (Vdd) The N⁺ type region 148 has been connected to the ground terminal (GND). Both the P⁺ type region 143 and the N⁺ type region 147 have been connected to the signal output terminal (OUT). Both the gate electrode 145 and the gate electrode 150 have been connected to the signal input terminal (IN).

As to the power supply protection diode 121 and the gate protection diode 122 shown in FIG. 20, trenches 131 and 133 have been elongated from the major front surface 130*a* of the substrate 130 along the thickness direction, and N type silicon layers (second conductivity type semiconductor layers) 132 and 134 made of epitaxial films have been formed in the trenches 131 and 133. In inner planes of the trenches 131 and 133 whose aspect ratios are larger than "1", the protection diodes own PN junctions constituted by the P⁻ type substrate 130 and the N type silicon layers 132 and 134. The N type silicon layer 132 on the cathode side has been connected to the power supply terminal (Vdd). Also, the N type silicon layer 134 on the cathode side has been connected to the signal input terminal (gate electrode of internal terminal). The P⁻ type silicon substrate 130 on the anode side has been grounded via a contact-purpose P⁺ type region 130*c* on the rear surface of the substrate 130.

It should also be understood that the power element of the seventh embodiment and the CMOS inverter 100 of this 11-th embodiment may be alternatively applied to a composite monolithic IC.

Also, it should be understood that the conductivity types (N types and P types) indicated in FIGS. 19 and 20 may be alternatively reversed.

Also, in this 11-th embodiment, the structure as explained in the second embodiment may be employed. That is to say, as represented in FIG. 3, the semiconductor substrate 10 may be realized by that the first conductivity type silicon layer (epitaxial film) 12 having the low concentration has been formed on the first conductivity type substrate 11 having the high concentration, and the diode forming-purpose trench 2 has been formed in this silicon layer (epitaxial film) 12. Also, as shown in FIG. 4, the semiconductor substrate 15 may be constituted by that the low concentration semiconductor layer forming-purpose trench 17 has been elongated from the major front surface of the first conductivity type substrate 16 having the high concentration along the thickness direction, and the first conductivity type semiconductor layer 18 having the low concentration has been formed inside the trench 17, while the diode forming-purpose trench 2 may be formed inwardly with respect to the semiconductor layer 18 within the trench 17. Since this 11-th embodiment employs the structure of the second embodiment (FIGS. 3 and 4), the protection diode may function as a high withstanding voltage protection diode.

Also, as previously explained in the third embodiment, in this 11-th embodiment, in FIGS. 19 and 20, bottom planes of the trenches 104, 106, 131, and 133 are made circular, and bottom portions of the N type silicon layers (second conductivity type semiconductor layers) 105, 107, 132, and 134 are formed in round shapes. As a consequence, concentration of currents caused by break down occurred in the bottom portions can be relaxed, so that the protection functions of the protection diodes can be improved. Furthermore, as previously explained in the fourth embodiment, in this 11-th embodiment, contact-purpose low resistance layers may be embedded inwardly with respect to the N type silicon layers (second conductivity type semiconductor layers) 105, 107, 132, and 134 within the trenches 104, 106, 131, and 133. As a result, local deviation of currents along the substrate thickness direction can be suppressed, so that the protection functions of the protection diodes can be improved.

In the above-explained respective embodiments, the semiconductor is silicon (Si). However, the present invention is not limited only to this silicon material, but may be applied to other materials, for example, GaN and SiC.

The present disclosure has the following aspects.

According to a first aspect of the present disclosure, a semiconductor device includes: a semiconductor substrate having a first surface and a second surface, wherein the semiconductor substrate has a first conductive type; a first trench extending from the first surface of the semiconductor substrate in a depth direction perpendicular to the first surface of the semiconductor substrate; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio between a depth and a width, the aspect ratio being equal to or larger than 1.

The above device provides a diode having a small plan area and a low resistance.

Alternatively, the semiconductor substrate may include a high concentration layer having the first conductive type and an epitaxial low concentration layer having the first conductive type. The high concentration layer has an impurity concentration higher than an impurity concentration of the epitaxial low concentration layer. The epitaxial low concentration layer is disposed on the high concentration layer. The first surface of the semiconductor substrate is provided by the epitaxial low concentration layer so that the first trench is disposed in the epitaxial low concentration layer. In this case, the diode has a high withstand voltage and a low resistance.

Alternatively, the semiconductor substrate may include a high concentration layer having the first conductive type and a low concentration layer having the first conductive type. The high concentration layer has an impurity concentration higher than an impurity concentration of the low concentration layer. The semiconductor substrate further includes a second trench. The first trench is disposed inside of the second trench so that the low concentration layer is embedded between the second trench and the first trench. The second trench extends from the first surface of the semiconductor substrate in the depth direction. In this case, the diode has a high withstand voltage and a low resistance.

Alternatively, the first trench may have a rounded bottom so that the epitaxial semiconductor layer has a rounded bottom. In this case, the electric field concentration at the bottom of the first trench is reduced, so that the withstand voltage of the diode is increased. Thus, the diode has a high withstand voltage, a low resistance and a small plan area.

Alternatively, the device may further include: a low resistance layer for connecting with an electrode. The low resistance layer is embedded in the epitaxial semiconductor layer in such a manner that the low resistance layer is exposed on the first surface of the semiconductor substrate. In this case, the local current concentration in the depth direction of the substrate is reduced, so that the diode has a low resistance.

According to a second aspect of the present disclosure, a semiconductor device includes: a semiconductor switching element; a protection diode for protecting the semiconductor switching element; and a semiconductor substrate having a first surface and a second surface. The semiconductor switching element and the protection diode are integrated into one chip so that the semiconductor switching element and the protection diode are disposed in the semiconductor substrate. The semiconductor substrate has a first conductive type. The protection diode includes: a first trench extending from the first surface of the semiconductor substrate in a depth direction perpendicular to the first surface of the semiconductor substrate; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio between a depth and a width, the aspect ratio being equal to or larger than 1.

The above device provides a diode having a small plan area and a low resistance. Thus, the plan chip area of the device is reduced.

Alternatively, the semiconductor substrate may include a high concentration layer having the first conductive type, a low concentration layer having the first conductive type, and a second trench. The high concentration layer has an impurity concentration higher than an impurity concentration of the low concentration layer of the protection diode. The first trench of the protection diode is disposed inside of the second trench so that the low concentration layer is embedded between the second trench and the first trench. The PN junction is provided by an interface between the epitaxial semiconductor layer and the low concentration layer. The second trench of the protection diode extends from the first surface of the semiconductor substrate in the depth direction. In this case, the protection diode has a high withstand voltage.

Alternatively, the semiconductor switching element may be a three dimensional power MOSFET. The three dimensional power MOSFET includes: a third trench extending from the first surface of the semiconductor substrate in the depth direction; a drift semiconductor layer disposed in the third trench, wherein the drift semiconductor layer has the first conductive type and a low impurity concentration lower than the high concentration layer of the semiconductor substrate; a base semiconductor layer embedded in the drift semiconductor layer, wherein the base semiconductor layer has the second conductive type; a source semiconductor layer embedded in the base semiconductor layer, wherein the source semiconductor layer has the first conductive type; a fourth trench extending from the first surface of the semiconductor substrate in the depth direction, wherein the fourth trench is disposed inside of the third trench, and wherein the fourth trench extends between the source semiconductor layer and the drift semiconductor layer so that the fourth trench penetrates the base semiconductor layer; a gate electrode disposed in the fourth trench through a gate insulation film, wherein the gate insulation film is disposed on an inner wall of the fourth trench; and a drain region provided by the high concentration layer of the semiconductor substrate. The first trench of the protection diode has a depth substantially equal to a depth of the third trench of the three dimensional power MOSFET. The low concentration layer of the protection diode and the drift semiconductor layer of the MOSFET are made of a same epitaxial film. The epitaxial semiconductor layer of the protection diode and the base semiconductor layer of the MOSFET are made of a same epitaxial film. In this case, the device has a small chip area. Further, the steps of forming the protection diode becomes simple so that the manufacturing cost of the device is reduced.

Alternatively, the first trench of the protection diode may have a width in a direction along the low concentration layer toward the epitaxial semiconductor layer. The third trench of the MOSFET has a width in a direction along the drift semiconductor layer toward the source semiconductor layer. The width of the first trench of the protection diode is smaller than the width of the third trench of the MOSFET. In this case, the low concentration layer of the substrate is compactly formed in the second trench, so that the protection effect of the protection diode is improved.

According to a third aspect of the present disclosure, a semiconductor device includes: a semiconductor integrated circuit; a protection diode for protecting the semiconductor integrated circuit; and a semiconductor substrate having a first surface and a second surface. The semiconductor integrated circuit and the protection diode are integrated into one chip so that the semiconductor integrated circuit and the protection diode are disposed in the semiconductor substrate. The semiconductor substrate has a first conductive type. The protection diode includes: a first trench extending from the first surface of the semiconductor substrate in a depth direction perpendicular to the first surface of the semiconductor substrate; and an epitaxial semiconductor layer having a second conductive type, wherein the epitaxial semiconductor layer is disposed in the first trench. The first trench includes an inner wall as an interface between the semiconductor substrate and the epitaxial semiconductor layer so that the interface provides a PN junction. The first trench has an aspect ratio between a depth and a width, the aspect ratio being equal to or larger than 1.

The above device provides a diode having a small plan area and a low resistance. Thus, the plan chip area of the device is reduced.

According to a fourth aspect of the present disclosure, a method for manufacturing a semiconductor device includes: forming the third trench of the three dimensional power MOSFET together with the second trench of the semiconductor substrate; forming the drift semiconductor layer in the third trench of the MOSFET together with forming the low concentration layer in the second trench of the semiconductor substrate, wherein the drift semiconductor layer and the low concentration layer are made of an epitaxial film; and embedding the base semiconductor layer in the drift semiconductor layer together with embedding the epitaxial semiconductor layer in the low concentration layer, wherein the base semiconductor layer and the epitaxial semiconductor layer are made of an epitaxial film.

In the above method, the planar chip area of the device is minimized with a simple method for forming the protection diode.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device, the semiconductor device comprising:
    semiconductor switching element;
    a protection diode for protecting the semiconductor switching element; and
    a semiconductor substrate having a first surface and a second surface, wherein
        the semiconductor switching element and the protection diode are integrated into one chip so that the semiconductor switching element and the protection diode are disposed in the semiconductor substrate,
        the semiconductor substrate has a first conductive type,
        the protection diode includes:
            a first trench extending from the first surface of the semiconductor substrate in a depth direction perpendicular to the first surface of the semiconductor substrate; and
            an epitaxial semiconductor layer having a second conductive type, wherein the epitaxial semiconductor layer is disposed in the first trench,
        the first trench includes an inner wall as an interface between the semiconductor substrate and the epitaxial semiconductor layer so that the interface provides a PN junction,
        the first trench has an aspect ratio between a depth and a width, the aspect ratio being equal to or larger than 1,
        the semiconductor substrate includes a high concentration layer having the first conductive type, a low concentration layer having the first conductive type, and a second trench,
        the high concentration layer has an impurity concentration higher than an impurity concentration of the low concentration layer of the protection diode,
        the first trench of the protection diode is disposed inside of the second trench so that the low concentration layer is embedded between the second trench and the first trench,
        the PN junction is provided by an interface between the epitaxial semiconductor layer and the low concentration layer, the second trench of the protection diode extends from the first surface of the semiconductor substrate in the depth direction, the semiconductor switching element is a three dimensional power MOSFET, the three dimensional power MOSFET includes:
- a third trench extending from the first surface of the semiconductor substrate in the depth direction;
- a drift semiconductor layer disposed in the third trench, wherein the drift semiconductor layer has the first conductive type and a low impurity concentration lower than the high concentration layer of the semiconductor substrate;
- a base semiconductor layer embedded in the drift semiconductor layer, wherein the base semiconductor layer has the second conductive type;
- a source semiconductor layer embedded in the base semiconductor layer, wherein the source semiconductor layer has the first conductive type;
- a fourth trench extending from the first surface of the semiconductor substrate in the depth direction, wherein the fourth trench is disposed inside of the third trench, and wherein the fourth trench extends between the source semiconductor layer and the drift semiconductor layer so that the fourth trench penetrates the base semiconductor layer;
- a gate electrode disposed in the fourth trench through a gate insulation film, wherein the gate insulation film is disposed on an inner wall of the fourth trench; and
- a drain region provided by the high concentration layer of the semiconductor substrate, the first trench of the protection diode has a depth substantially equal to a depth of the third trench of the three dimensional power MOSFET, the low concentration layer of the protection diode and the drift semiconductor layer of the MOSFET are made of a same epitaxial film, and the epitaxial semiconductor layer of the protection diode and the base semiconductor layer of the MOSFET are made of a same epitaxial film; and the method comprising:

forming the third trench of the three dimensional power MOSFET together with the second trench of the semiconductor substrate;

forming the drift semiconductor layer in the third trench of the MOSFET together with forming the low concentration layer in the second trench of the semiconductor substrate, wherein the drift semiconductor layer and the low concentration layer are made of an epitaxial film; and embedding the base semiconductor layer in the drift semiconductor layer together with embedding the epitaxial semiconductor layer in the low concentration layer, wherein the base semiconductor layer and the epitaxial semiconductor layer are made of an epitaxial film.

* * * * *